United States Patent
Kilambi et al.

(10) Patent No.: US 10,615,819 B1
(45) Date of Patent: Apr. 7, 2020

(54) MODIFIED PI-SIGMA-DELTA-MODULATOR BASED DIGITAL SIGNAL PROCESSING SYSTEM FOR WIDE-BAND APPLICATIONS

(71) Applicants: Sai Mohan Kilambi, Ottawa (CA); Lan Hu, Ottawa (CA)

(72) Inventors: Sai Mohan Kilambi, Ottawa (CA); Lan Hu, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/179,013

(22) Filed: Nov. 2, 2018

(51) Int. Cl.
*H03M 3/00* (2006.01)
*H03M 7/36* (2006.01)

(52) U.S. Cl.
CPC ........... *H03M 3/352* (2013.01); *H03M 3/414* (2013.01); *H03M 3/436* (2013.01); *H03M 3/496* (2013.01); *H03M 7/3022* (2013.01)

(58) Field of Classification Search
CPC ...... H03M 3/352; H03M 3/414; H03M 3/436; H03M 3/496
USPC .................................. 341/143–155; 375/295
See application file for complete search history.

(56) References Cited

U.S. PATENT DOCUMENTS

| | | | |
|---|---|---|---|
| 9,276,602 B1 * | 3/2016 | Pagnanelli | H03M 3/358 |
| 9,419,637 B1 * | 8/2016 | Pagnanelli | H03M 3/38 |
| 2007/0021090 A1 | 1/2007 | Wetzker et al. | |
| 2009/0110217 A1 * | 4/2009 | Yasuda | H03H 15/00 |
| | | | 381/120 |
| 2010/0328125 A1 * | 12/2010 | Pagnanelli | H03M 3/468 |
| | | | 341/143 |
| 2011/0095927 A1 * | 4/2011 | Pagnanelli | H03M 3/468 |
| | | | 341/166 |

(Continued)

FOREIGN PATENT DOCUMENTS

| | | |
|---|---|---|
| CN | 1820419 A | 8/2006 |
| CN | 106817138 A | 6/2017 |
| CN | 107005206 A | 8/2017 |

OTHER PUBLICATIONS

Ian Galton et.al. "Delta-Sigma Modulator Based A/D Conversion with Oversampling", IEEE Transactions on Circuits and Systems—II: Analog and Digital Signal Processing, vol. 42, No. 12, Dec. 1995.

(Continued)

*Primary Examiner* — Lam T Mai

(57) ABSTRACT

An apparatus for a signal processor for Wide-Band Applications is provided. The signal processor includes a plurality of parallel branches. Each parallel branch includes a frequency shifter, a sigma-delta-modulator, and a filter. The output signal of each branch is combined via a signal recombiner. The signal processor is suitable for wide-band applications due to centering the zeros of the sigma-delta-modulator's noise transfer function and filter's noise transfer function at the frequency of the frequency shifter in the same branch of the signal processor. Centering these zeros at the frequency of the frequency shifter shapes the quantization noise added by the sigma-delta-modulator away from the input signal frequency to make it easier to remove the quantization noise. This wideband performance is also achieved due to the design of the embodiment's filters. The embodiments of this invention use filters with symmetric transition bands and a pass-band that is wide enough for use in wireless applications.

19 Claims, 23 Drawing Sheets

(56) References Cited

U.S. PATENT DOCUMENTS

| | | | |
|---|---|---|---|
| 2011/0163900 A1* | 7/2011 | Pagnanelli | H03M 3/468 |
| | | | 341/143 |
| 2012/0127009 A1* | 5/2012 | Pagnanelli | H03M 3/468 |
| | | | 341/143 |
| 2016/0072520 A1* | 3/2016 | Pagnanelli | H03M 3/468 |
| | | | 341/143 |
| 2016/0322982 A1* | 11/2016 | Pagnanelli | H03M 1/0626 |
| 2016/0373125 A1* | 12/2016 | Pagnanelli | H03M 3/404 |
| 2017/0222657 A1* | 8/2017 | Ullmann | H03M 3/414 |
| 2018/0109268 A1* | 4/2018 | Kong | H03H 17/02 |
| 2018/0302048 A1* | 10/2018 | Donoghue | H03F 3/2175 |

OTHER PUBLICATIONS

D. S. Palguna et.al, "Millimeter wave receiver Design using low precision quantization and parallel $\Sigma\Delta$ architecture", IEEE Transactions on Wireless Communications, vol. 15, No. 10, Oct. 2016.

\* cited by examiner

MODIFIED PI-SIGMA-DELTA-MODULATOR BASED DIGITAL SIGNAL PROCESSING SYSTEM FOR WIDE-BAND APPLICATIONS

FIELD OF THE INVENTION

The present invention pertains to the field of communications, and in particular, towards signal processors for wide-band communication.

BACKGROUND

Traditional sigma-delta based Digital Signal Processors (DSPs) are well known. However, traditional sigma-delta based DSPs require significant oversampling and noise shaping to remove quantization noise. Pi-sigma-delta modulators require a lower oversampling rate than the oversampling rate required by traditional sigma-delta based DSPs. Pi-sigma-delta modulators include parallel branches with each branch including a sigma-delta modulator and filter. This oversampling rate reduction is proportional to the number of branches of sigma-delta modulators and filters.

However, prior art Pi-Sigma-Delta modulators have been limited to low bandwidth. There is a need for Sigma-Delta modulators which can accommodate higher bandwidth signals.

This background information is provided to reveal information believed by the applicant to be of possible relevance to the present invention. No admission is necessarily intended, nor should be construed, that any of the preceding information constitutes prior art against the present invention.

SUMMARY

An aspect of this disclosure provides a signal processor that effectively shapes noise and smoothes error at wide-band operating frequencies. Accordingly some embodiments include a signal processor for shaping noise and smoothing error of a digital signal.

An aspect of the disclosure provides a Signal Processor (SP). Such a Signal Processor includes a first branch including a first sigma-delta modulator having an associated first noise transfer function (NTF), and a first frequency shifter configured to shift a first portion of an input signal to a first frequency. Such a Signal Processor also includes a second branch parallel to the first branch including a second sigma-delta modulator having an associated second NTF that is different than the first NTF, and a second frequency shifter configured to shift a second portion of the input signal to a second frequency that is different than the first frequency. Such a Signal Processor also includes a signal recombiner for combining the output of the first and second branches. In some embodiments the first NTF has zeros centered at the first frequency and the second NTF has zeros centered at the second frequency. In some embodiments the SP includes the first branch that includes a first filter with a passband at the first frequency and the second branch that includes a second filter with a passband at the second frequency. In some embodiments the SP further comprises a third branch. In such embodiments, the third branch includes a third sigma-delta modulator having an associated third NTF that is different than the first NTF and the second NTF, the third NTF having a zero centered at a third frequency different than the first and second frequencies, a frequency shifter for shifting the input signal to the third frequency, and a third filter having a passband at the third frequency. In some embodiments the SP further comprises a fourth branch including a fourth sigma-delta modulator having an associated fourth NTF having zeros centered at the third frequency and a fourth frequency shifter for shifting the input signal to the third frequency and for shifting the input signal in phase by $\pi/2$ radians and a fourth filter having a passband at the third frequency. In some embodiments the fourth branch includes a fourth sigma-delta modulator having an associated fourth NTF that is the same as one of the first NTF, the second NTF and third NTF. In some embodiments each of the sigma-delta modulators are one of: first order sigma-delta modulator, a second order sigma-delta modulator, and third order sigma-delta modulator. In some embodiments the frequency shifter in each branch includes a multiplier and a Hadamard code block that apply a Hadamard code to the input signal in each branch of the SP. In some embodiments the Hadamard code applied by each frequency shifter is orthogonal to the Hadamard code applied by each other frequency shifter. In some embodiments the NTF of each branch is matched to the Hadamard code associated with the frequency shifter of that branch such that quantization noise is shaped away from the shifted frequency of that branch. In some embodiments, at least one of the first and second sigma-delta modulator and corresponding filter are formed from a seven element Finite Impulse Response (FIR) Filter. In some embodiments the first frequency shifter applies Hadamard code 1, 1, 1, 1; the second frequency shifter applies Hadamard code 1, −1, 1, −1; the third frequency shifter applies Hadamard code 1, −1, −1, 1; and the fourth frequency shifter applies Hadamard code −1, −1, 1, 1. In some embodiments the sigma-delta modulator and filter of each branch are formed from an eleven element Finite Impulse Response (FIR) Filter. In some embodiments a length of the Hadamard code associated with each Hadamard code block is equal to the number of parallel branches each receiving an input signal. In some embodiments the NTF of each branch are related. In some embodiments the NTF of the second branch uses the NTF of the first branch shifted by $je^{j\pi n}$ where n=(k Mod N) where N is 2 and k is {0,1}. In some embodiments the NTF of the third branch uses the NTF of the second branch shifted by upsampling by 2. In some embodiments the third and fourth filters include symmetric transition bands; and passband centered at $\pi/2$ and $3\pi/2$ radians/sample. In some embodiments the signal recombiner includes an adder, and for each branch, a multiplier for multiplying the output from the filter with the Hadamard code of that branch.

An aspect of the disclosure provides a signal processor comprising a plurality of branches, each branch of the plurality of branches includes a frequency shifter, a sigma-delta modulator and a filter. Each frequency shifter is configured to apply a frequency shift orthogonal to the frequency shift applied by the frequency shifters of other branches, and the sigma-delta modulator of each of the plurality of branches has a noise transfer function matched to the frequency shifter of that branch. The orthogonal nature of these frequency shifters can result in a smoothing of unfiltered in-band noise.

BRIEF DESCRIPTION OF THE FIGURES

Further features and advantages of the embodiments will become apparent from the following detailed description, taken in combination with the appended drawings, in which:

FIG. 3 also includes a model of the quantization noise added by each branch's sigma-delta modulator;

It will be noted that throughout the appended drawings, like features are identified by like reference numerals.

DETAILED DESCRIPTION

Figures 1A, 1B:
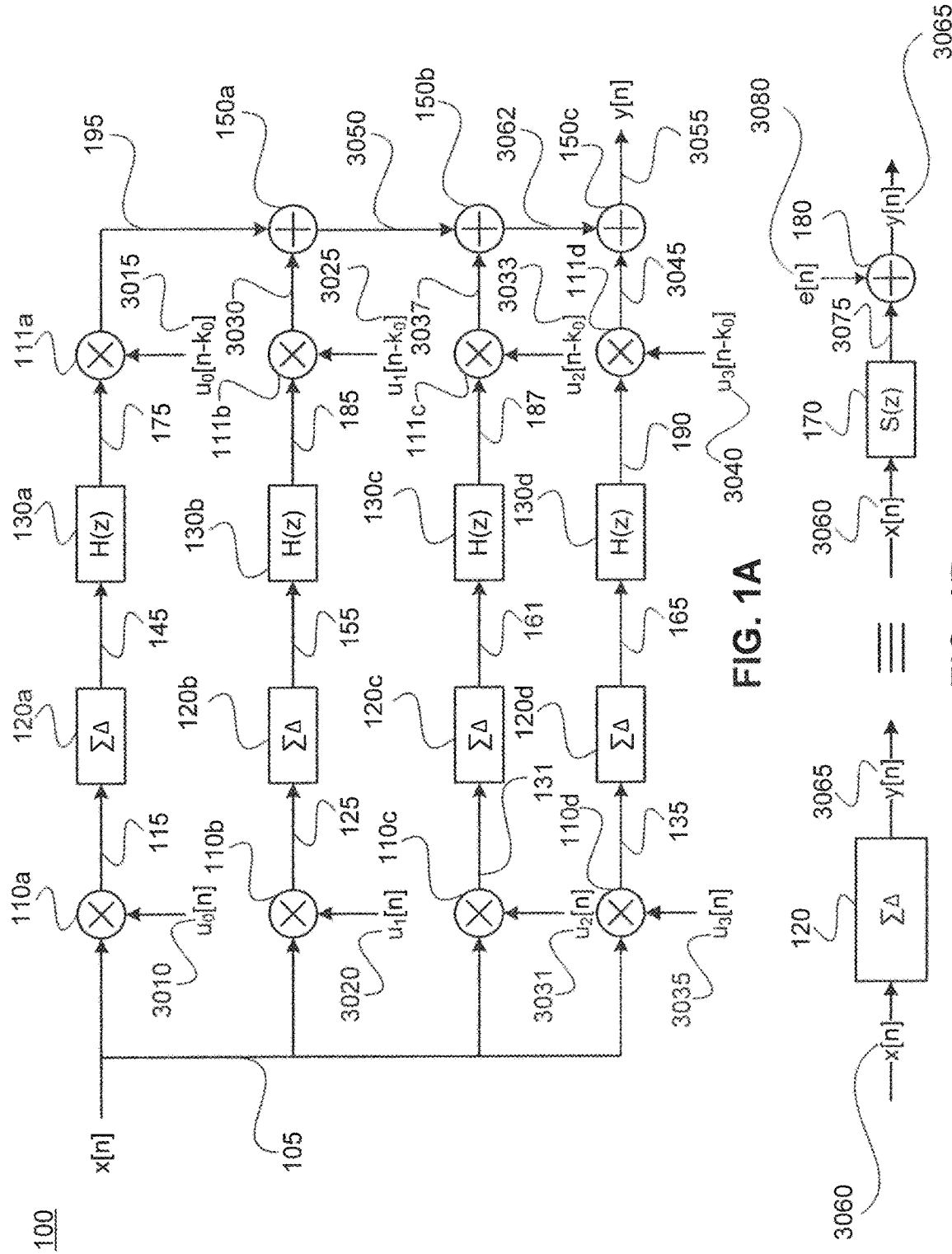
FIGS. 1A-B illustrate the architecture of a Pi-Sigma-Delta modulator where the same sigma-delta-modulator and the same filter are instantiated in all branches of the DSP.

FIG. 1A illustrates a Pi-Sigma-Delta modulator 100 including a plurality of branches (a, b, c and d) each including a sigma-delta modulator (120a, 120b, 120c, and 120d) and filter (130a, 130b, 130c and 130d). It should be understood that sigma-delta modulators are also called delta-sigma modulators. As shown in FIG. 1, the input signal x[n] 105 serves as the input for each branch. This signal, x[n], is the output of a Sample and Hold Circuit (not shown). The output of the Sample and Hold circuit, x[n], is a time quantized signal. As the input signal x[n] 105 is a time quantized signal a portion of this input signal is sent to each branch via direct electrical connection to each branch, although it should be appreciated that a signal splitter or the like can be used. Quantization noise is added by the sigma delta modulator. In some embodiments, the input signal for each branch is modulated by multiplying x[n] 105, via multiplier 110a, 110b, 110c and 110d, by a Hadamard code. The Hadamard codes illustrated in FIG. 1 that are included to perform this modulation are $u_0[n]$ 3010 in the first branch, $u_1[n]$ 3020 in the second branch, $u_2[n]$ 3031 in the third branch and $u_3[n]$ 3035 in the fourth branch. These Hadamard codes are orthogonal to each other and this orthogonal property causes noise cancellation when the Hadamard modulated noise of the branches are combined.

A person having ordinary skill in the art will understand that the Hadamard code length is, in this example, equal to the number of parallel branches in the Pi-Sigma-Delta modulator.

A person having ordinary skill in the art will also understand that the number of parallel branches in the Pi-Sigma-Delta modulator reduces the required sampling rate as compared to a traditional Sigma-delta based DSP. For example the sampling rate of a Pi-Sigma-Delta modulator is sampling rate=Fs/m, where Fs is the sampling rate of a traditional sigma-delta based modulator and m is the number of parallel branches in the Pi-Sigma-Delta modulator.

The Hadamard modulated signals 115, 125, 131 and 135 are then applied to low sample rate sigma-delta modulator 120a, 120b, 120c and 120d respectively. In some embodiments, signal x[n] 105 is a digital signal and the low sample rate sigma-delta modulator (120a, 120b, 120c and 120d) in each branch modulates signals 115, 125, 131 and 135 to shape the noise present in the respective branches. A person having ordinary skill in the art will understand that in other embodiments, signal 105 can be an analog signal, x(t), and sigma-delta modulators (120a, 120b, 120c and 120d) shape the noise present in the respective branches. In other words, embodiments are equally applicable to analog and digital signals.

FIG. 1B illustrates an example of such a signal conversion. In FIG. 1B, input signal x[n] 3060's noise is shaped by sigma-delta modulator 120. However, sigma-delta modulator 120 also adds noise to digital output signal y[n] 3065. To illustrate the noise added by sigma-delta modulator 120 to sigma-delta modulator 120's digital output, sigma-delta modulator 120 is modeled as S(z) 170, adder 180, and noise e[n]. Digital input signal x[n] 3060 is applied to S(z) 170. S(z) amplitude quantizes signal x[n] and adds quantization noise e[n] 3080. Adder 180 sums digital signal 3075 and noise e[n] 3080 to create y[n] 3065. Therefore, digital signals 145, 155, 161 and 165 are each a combination of digital signal and noise as modeled by signal y[n] 3065.

Hadamard codes $u_0[n]$ 3010 in the first branch, $u_1[n]$ 3020 in the second branch, $u_2[n]$ 3031 in the third branch and $u_3[n]$ 3035 in the $4^{th}$ branch modulate x[n] 105. Despite different modulation in each branch, the same sigma delta modulator, each with the same noise transfer function, is used in each branch. The noise transfer function of sigma-delta modulator 120a, 120b, 120c and 120d shape the digital output signal's noise. The signal and shaped noise 145 on the first branch, 155 on the second branch, 161 on the third branch and 165 on the fourth branch are then applied to filter H(z) 130a, 130b, 130c and 130d respectively. Filter H(z) 130 removes a portion of the noise at frequencies that are outside of filter H(z) 130's passband.

The signal and filtered noise, filtered by H(z) 130a, 130b, 130c and 130d, is then multiplied, via output multiplier 111a, 111b, 111c and 111d, with Hadamard code $u_0[n-k_0]$ 3015 in the first branch, $u_1[n-k_0]$ 3025 in the second branch, $u_2[n-k_0]$ 3033 in the $3^{rd}$ branch and $u_3[n-k_0]$ 3040 in the 4th branch. This multiplication in some embodiments modulates the signal and noise 175, 185, 187 and 190 to demodulate the Hadamard modulated signal that was modulated by Hadamard code 3010 in the first branch, 3020 in the second branch, 3031 in the third branch and 3035 in the fourth branch. For example, if the first set of Hadamard codes 3010, 3020, 3031 and 3035 shift x[n] away from the baseband frequency, then the second set of Hadamard codes 3015, 3025, 3033 and 3040 demodulate the sigma delta modulated signals back to the baseband frequency.

The demodulated signal and unfiltered modulated noise of the first branch 195 and the demodulated signal and unfiltered modulated noise of the second branch 3030 are summed via adder 150a. The summed signal 3050 is summed with the demodulated signal and unfiltered modulated noise 3037 of the 3rd branch via adder 150b to produce signal 3062. The sum of the demodulated signals and unfiltered modulated noise of the first branch, second branch, and third branch 3062 are summed with the output of the fourth branch 3045 by adder 150c to produce the output from the Pi-Sigma-Delta -modulator y[n] 3055. Due to the orthogonal nature of the Hadamard codes, the error of combined signals 3055 is smoothed by further cancellation of unfiltered in-band noise.

Figure 2:
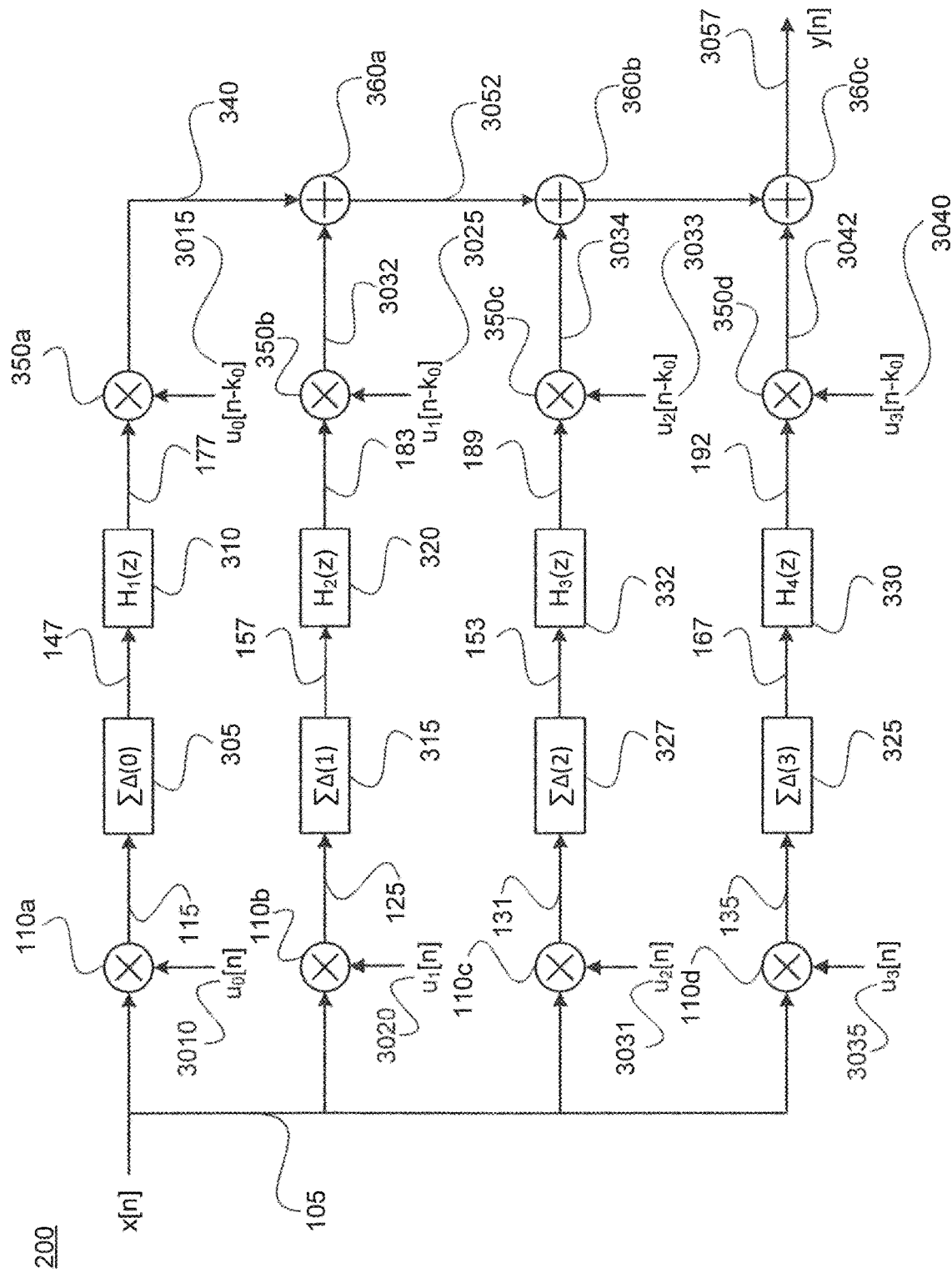
FIG. 2 illustrates a high level block diagram of a Pi-Sigma-Delta modulator for wide band applications including different sigma-delta modulators and filters in each branch.

FIG. 2 illustrates an embodiment of a Pi-Sigma-Delta-modulator 200 where each branch contains a different sigma-delta converter (305, 315, 327 and 325) and also a different H(z) filter (310, 320, 332, 330), both of which are matched to the frequency of the frequency shifter in the same branch. In the embodiment illustrated in FIG. 3, each frequency shifter includes a mixer (110a, 110b, 110c, and 110d) and a Hadamard code block (3010, 3020, 3031, 3035) that apply a Hadamard code to the input signal in each branch. Accordingly, the Hadamard codes, in conjunction with multiplier 110, are examples of frequency shifters that shift the frequency of the input signal. It is noted that Pi-Sigma-Delta-modulator 200, which can be implemented in a DSP, includes different sigma-delta converters and H(z) filters that are matched to the frequency of the branch's frequency shifter in each branch. The input signal, x[n] 105 in this embodiment, is shifted in frequency by frequency shifters that modulate the input signal with a plurality of Hadamard codes. The frequency shifters modulate input signal x[n] 105 by multiplying x[n] 105, via multiplier 110, by Hadamard code $u_0[n]$ 3010 in the first branch, $u_1[n]$ 3020 in the second branch, $u_2[n]$ 3031 in the third branch, and $u_3[n]$ 3035 in the fourth branch.

Discussing an example where Pi-Sigma-Delta modulator 200 shapes and filters signal x[n] 105's noise, sigma-delta modulators add noise to the digital signal. The noise added by sigma-delta modulator 305 to digital signal 147 is filtered by $H_1(z)$ 310. Filter $H_1(z)$ 310 and sigma-delta modulator 305 are designed together such that the noise added by sigma-delta modulator 305 is filtered by Filter $H_1(z)$ 310 without filtering the x[n] 105 modulated by Hadamard code $u_0[n]$ 3010. Filter design for each branch is different. Use of Half-band filters and other symmetric transition band filters are used to reduce resource cost of channel filters.

Some of the out of band noise included with signal 157, 153, and 167 is filtered by $H_2(z)$ 320, $H_3(z)$ 332, and $H_4(z)$ 330 respectively. $H_2(z)$ 320 is optimized to filter a portion of the out of band noise added by sigma-delta modulator 315 without filtering x[n] 105 modulated by Hadamard code $u_1[n]$ 3020. $H_3(z)$ 332 is optimized to filter a portion of the out of band noise added by sigma-delta modulator 327 without filtering x[n] 105 modulated by Hadamard code $u_2[n]$ 3031. $H_4(z)$ 330 is also optimized to filter a portion of the out of band noise added by sigma-delta modulator 325 without shaping x[n] 105 modulated by Hadamard code $u_3[n]$ 3035. $H_2(z)$ 320, $H_3(z)$ 332, and $H_4(z)$ 330 are optimized by designing the center frequency of $H_2(z)$ 320's passband, $H_3(z)$ 332's passband, and $H_4(z)$ 330's passband to be the same frequency as Hadamard code $u_1[n]$ 3020's modulation frequency, Hadamard code $u_2[n]$ 3031's modulation frequency, and Hadamard code $u_3[n]$ 3035's modulation frequency respectively. Therefore, the embodiment's sigma-delta modulator's Noise Transfer Function (NTF) is optimized to shape noise in signal x[n] and H(z) filter is optimized to filter noise added by the branch's sigma-delta modulator without filtering x[n] 105 modulated by the branch's Hadamard code.

While FIG. 2 illustrates four branches, those skilled in the art will appreciate that the total number of branches are a power of two due to the use of Hadamard codes. Therefore, some embodiments have two branches, other embodiments have four branches, other embodiments have eight branches. The number of images of eight branch Pi-Sigma-Delta based DSPs, and also embodiments with more than eight branches, increases the complexity of the sigma-delta-modulator's NTF and also the H(Z) filter design. Using a sigma-delta-modulator that is at most $3^{rd}$ order can provide stability in the feedback structure. Embodiments with more than four branches may have complicated NTF designs that can result in sub-optimal results.

It should be appreciated that the NTF of the sigma-delta-modulators should be simple and implementable in hardware. Therefore, 3rd order sigma-delta-modulators are currently recommended. Also, when each branch's sigma-delta-modulator is the same order, the result can improve performance and can result in a less complicated design.

Therefore, the sigma-delta-modulators in each branch of the illustrated embodiments are first order, second order, or third order sigma-delta-modulators.

Figure 3:
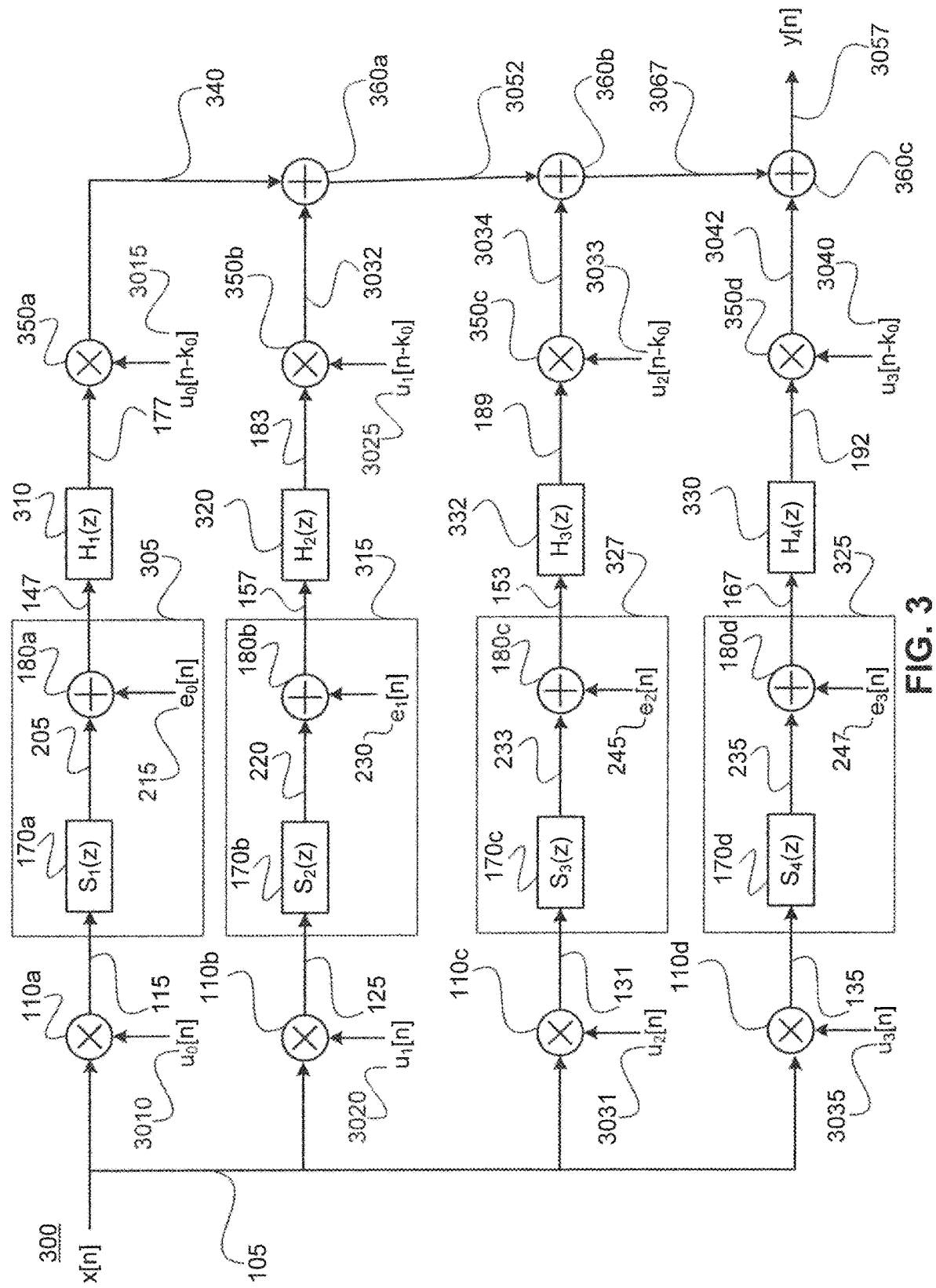
FIG. 3 illustrates a high level block diagram of a Pi-Sigma-Delta modulator for wide band applications including different sigma-delta modulators and filters in each branch.

FIG. 3 schematically illustrates the Pi-Sigma-Delta modulator 300, which schematically illustrates the quantization noise 215, 230, 245 and 247 added by each sigma-delta modulator 305, 315, 327, and 325 respectively to its output. FIG. 3 is similar to FIG. 2, in which each sigma-delta modulator 305, 315, 327, and 325 is modeled as S(z) 170 and adder 180 of FIG. 1B. Accordingly, sigma-delta-modulator 305 is schematically represented as $S_1(z)$ 170a, adder 180a, and quantization noise 215. Similarly, sigma-delta-modulator 315 is schematically represented as $S_2(z)$ 170b, adder 180b, and quantization noise 230. Similarly, sigma-delta-modulator 327 is schematically represented as $S_3(z)$ 170c, adder 180c, and quantization noise 245, while sigma-delta-modulator 325 is schematically represented as $S_4(z)$ 170d, adder 180d, and quantization noise 247. Similar to FIG. 2, the digital input signal, x[n] 105 is applied to the Pi-Sigma-Delta modulator and is modulated by multiplying x[n] 105 by Hadamard code $u_0[n]$ 3010 in the first branch, $u_1[n]$ 3020 in the second branch, $u_2[n]$ 3031 in the third branch, and $u_3[n]$ 3035 in the fourth branch. Each Sigma-Delta Modulator 170a, 170b, 170c and 170d shapes the noise of digital signals 115, 125, 131, and 135. Digital signal 205 is summed with quantization noise $e_0[n]$ 215, via adder 180a. Digital signal 220 is summed with quantization noise $e_1[n]$ 230, via adder 180b. Digital signal 233 is summed with quantization noise $e_2[n]$ 245, via adder 180c. Digital signal 235 is summed with quantization noise $e_3[n]$ 247, via adder 180d. Each Sigma-Delta Modulator 170a, 170b, 170c and 170d is designed so that the zeros of its NTF are located at the center of the of branch's Hadamard code's (3010, 3020, 3031, and 3035) modulation frequency. For example, the NTF of $S_1(z)$ 170a is designed to have a value of zero at the Hadamard modulation frequency of Hadamard code $u_0[n]$ 3010. Therefore, the zeros of the NTF for $S_1(z)$ 170a ideally only shape the quantization noise added by sigma delta modulator. The same applies for the second, third, and fourth branches.

The sum of digital signal and noise 147, 157, 153, and 167 are filtered by $H_1(z)$ 310, $H_2(z)$ 320, $H_3(z)$ 332, and $H_4(z)$ 330 respectively. $H_1(z)$ 310, $H_2(z)$ 320, $H_3(z)$ 332, and $H_4(z)$ 330 are optimized to include zeros at locations that filter a portion of the out-of band noise $e_0[n]$ 215, $e_1[n]$ 230, $e_2[n]$ 245, and $e_3[n]$ 247. This out of band noise is typically added by each sigma-delta modulator 170a, 170b, 170c and 170d without filtering the signals 115, 125, 131 and 135 modulated by Hadamard code $u_0[n]$ 3010 in the first branch, $u_1[n]$ 3020 in the second branch, $u_2[n]$ 3031 in the third branch, and $u_3[n]$ 3035 in the fourth branch. $H_1(z)$ 310, $H_2(z)$ 320, $H_3(z)$ 332, and $H_4(z)$ 330 can be optimized by designing the center frequency of $H_1(z)$ 310's passband, $H_2(z)$ 320's passband, $H_3(z)$ 332's passband, and $H_4(z)$ 330's passband to be the same frequency as Hadamard code $u_0[n]$ 3010's modulation frequency, $u_1[n]$ 3020's modulation frequency, Hadamard code $u_2[n]$ 3031's modulation frequency, and Hadamard code $u_3[n]$ 3035's modulation frequency respectively. The filtered sum of digital signal and noise 177, 183, 189, and 192 is then demodulated by multiplying 177 by Hadamard code $u_0[n-k_0]$ 3015 in the first branch, multiplying 183 by Hadamard code $u_1[n-k_0]$ 3025 in the second branch, multiplying 189 by Hadamard code $u_2[n-k_0]$ 3033 in the third branch, and multiplying 192 by Hadamard code $u_3[n-k_0]$ 3040 in the fourth branch. The demodulated digital signal and modulated noise signals 340 are summed with the demodulated digital signal and modulated noise signals 3032 via adder 360a. This summed signal 3052 is then summed with the demodulated signal and modulated noise 3034 via adder 360b. This summed signal 3067 is then summed with the demodulated signal and modulated noise 3042 via adder 360c and output from the Pi-Sigma-Delta modulator via y[n] 3057.

As stated, signal x[n] 105 is modulated via multiplication with Hadamard code $u_0[n]$ 3010 in the first branch and then signal 147 (the sum of digital signal 205 and noise $e_0[n]$ 215) are demodulated via multiplication with Hadamard code $u_0[n-k_0]$ 3015. Hadamard code $u_0[n-k_0]$ 3015 reverses the modulation of the signal by Hadamard code $u_0[n]$ 3010 and demodulates digital signal 105 and modulates noise with an orthogonal frequency. This demodulation of signal 105 and modulation of noise is performed in each branch. This demodulation of signal 105 and modulation of noise with an orthogonal frequency in each branch smoothes in-band noise when combined with the other branch's demodulated signal 105 and modulated noise.

Prior art Pi-Sigma-Delta modulators include the same sigma-delta modulator and filter in each branch. In other words, a sigma-delta modulator having the same noise transfer function is used in each branch. Similarly, the filters in each branch have the same passband characteristics. Embodiments of this invention include different sigma-delta modulators and filters in a plurality of branches of the Pi-Sigma-Delta modulator. These embodiments of the present invention may offer improved wide bandwidth performance. Use of the same sigma-delta modulator and filter in each branch, as taught in the art, results in a Pi-Sigma-Delta modulator that is unsuitable for wide-band applications. However, embodiments of this invention include a plurality of different sigma-delta modulators and filters in each branch of the Pi-Sigma-Delta modulator designed with zeros of their noise transfer functions centered at the frequency used by the frequency shifter of the same branch. Embodiments use of different sigma-delta modulators and filters that have noise transfer functions tuned to the frequency used by the frequency shifter in the same branch overcomes limitations of the prior art and therefore are suitable for wide-bandwidth applications.

It should also be understood that embodiments of the Pi-Sigma-Delta modulator described below are equally applicable to DSP and also to non-DSP based signal processors. For example, embodiments of the Pi-Sigma-Delta modulator can be designed without a DSP by including a combination of any or all of logic gates, gate arrays, and transistors in a field programmable gate array, an Integrated Circuit (IC) or an Application Specific Integrated Circuit (ASIC).

Figure 4:
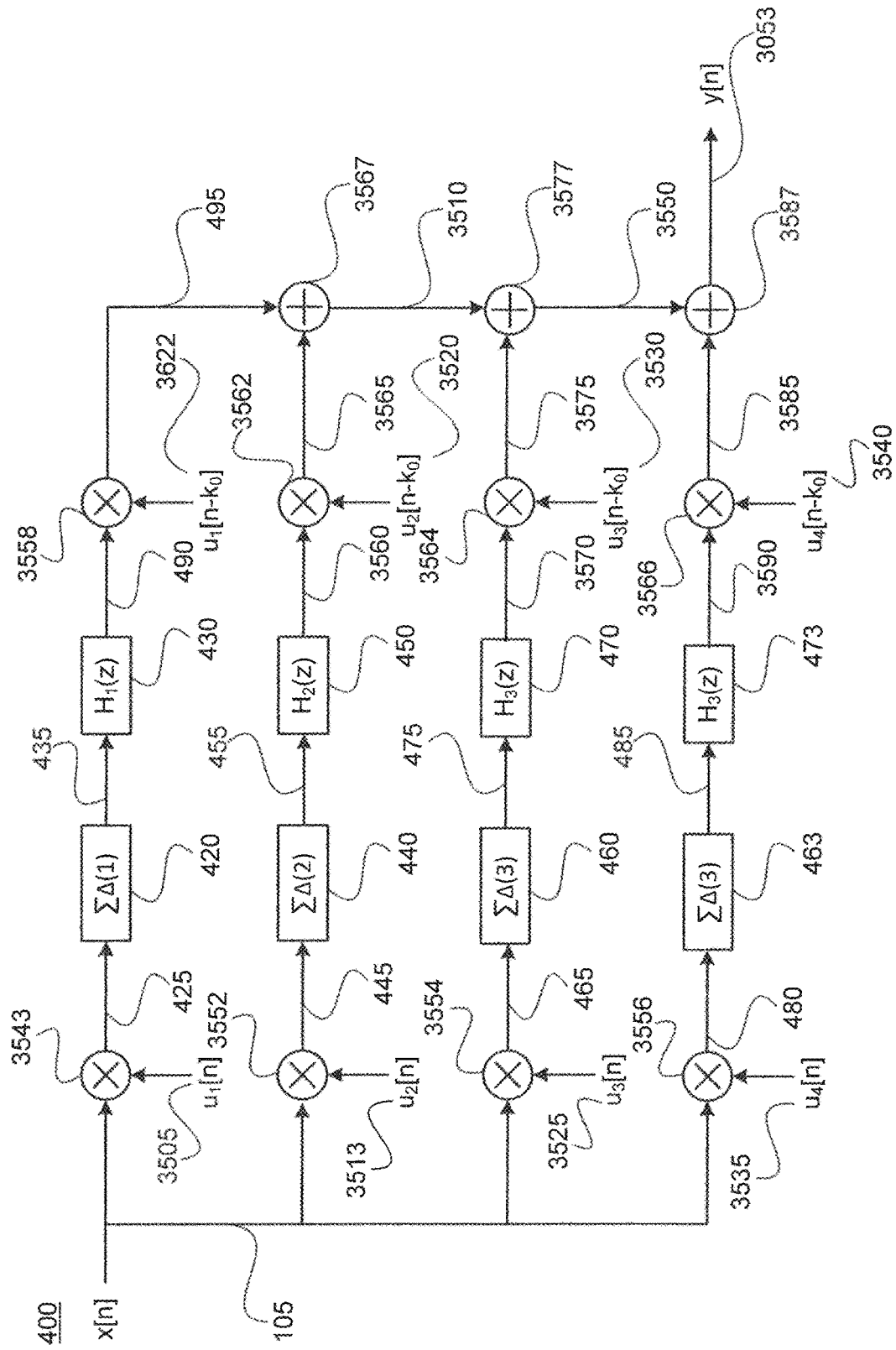
FIG. 4 illustrates a block diagram of an embodiment of a 4-branch Pi-Sigma-Delta modulator for wide band applications including different sigma-delta modulators and filters in the first, second, and third branches. The sigma-delta modulator and filter in the third and fourth branches are the same in this embodiment because the Hadamard modulated power spectral density of these branches is the same.

FIG. 4 illustrates an embodiment of a four branch Pi-Sigma-Delta -modulator wherein the sigma-delta-modulator and H(z) filter are the same in the third and fourth branches. As stated, the NTF of sigma-delta modulators 420, 440, 460 and their associated H(z) filter 430, 450, and 470 can be optimized to shape the noise added by sigma-delta-modulator 420, 440, 460, without shaping x[n] 105 modulated by the branch's Hadamard code $u_1[n]$ 3505, $u_2[n]$ 3513, $u_3[n]$ 3525, and $u_4[n]$ 3535 respectively.

The NTF of sigma-delta modulator 440 is derived by multiplying the NTF of sigma-delta modulator 420 by $je^{j\pi n}$, where n=(k Mod N) where N is 2 and k is {0,1}. Also, upsampling by 2 may result in simplification of the structure of the third and fourth branch's NTF. Also, upsampling by two may introduce 1 zero between successive coefficients. This may cause an image of the filter to show up at pi/2 and 3pi/2.

The third and fourth branches include sigma-delta-modulator 460 and 463 with the same NTF, and $H_3(z)$ 470 and 473 with the same transfer function. The third and fourth branch's sigma-delta-modulator and H(z) filter are different from the first branch's sigma-delta modulator 420 and $H_1(z)$ 430, and the second branch's sigma-delta modulator 440 and $H_2(z)$ 450.

The third and fourth branches include sigma-delta modulator 460 and 463 with the same NTF, and $H_3(z)$ 470 and 473 with the same transfer function because Hadamard codes $u_3[n]$ 3525 and $u_4[n]$ 3535 both modulate x[n] 105 to produce the same power spectral density. However, $u_4[n]$ 3535 also modulates x[n] 105's phase. Since the frequency modulation of Hadamard codes $u_3[n]$ 3525 and $u_4[n]$ 3535 produce the same power spectral density, sigma-delta-modulators 460 and 463 and H(z) filters 470 and 473 are tuned to the modulation frequency of Hadamard code $u_3[n]$ 3525 and also to the Hadamard code $u_4[n]$ 3535's modulation frequency. Therefore, the same sigma-delta-modulators 460 and 463 and H(z) filters 450 and 473 can be used in both the third and fourth branches.

Previous embodiments use Hadamard codes in each branch that are orthogonal to each other. As previously described, this orthogonality results in the statistical cancelling or smoothing of the in-band noise added by the sigma-delta-modulators when the Hadamard demodulated signal and modulated noise of each branch are summed. The orthogonality in these embodiments is due to Hadamard codes that are orthogonal. It should be appreciated that while example embodiments are discussed utilizing Hadamard codes, other orthogonal binary codes can be used.

The first, second, and third branches of this embodiment use Hadamard codes that are orthogonal to each other and therefore the dot product of these Hadamard codes is zero. Also, the first, second and fourth branches use Hadamard codes that are orthogonal to each other. However, the Hadamard codes in the third and fourth branches are orthogonal in phase to each other.

The orthogonality of the Hadamard codes of the third and fourth branches occurs even though the signal modulated by Hadamard code $u_3[n]$ 3525 and the signal modulated by Hadamard code $u_4[n]$ 3535 have the same power spectral density. This orthogonality is due to Hadamard code $u_4[n]$ 3535's phase modulation.

Hadamard codes $u_1[n-k_0]$ 3622, $u_2[n-k_0]$ 3520, and $u_3[n-k_0]$ 3530 are all orthogonal to each other. Also Hadamard codes $u_1[n-k_0]$ 3622, $u_2[n-k_0]$ 3520, and $u_4[n-k_0]$ 3540 are also all orthogonal to each other. Hadamard codes $u_3[n-k_0]$ 3530 and $u_4[n-k_0]$ 340 are orthogonal in phase due to $u_4[n-k_0]$ 3540's phase modulation. This orthogonality of Hadamard codes smooth error in unfiltered noise added by the sigma-delta-modulators because, when summed, the unfiltered noise added by sigma-delta-modulator 420 and modulated by $u_1[n-k_0]$ 3510, noise added by sigma-delta-modulator 440 and modulated by $u_2[n-k_0]$ 3520, noise added by sigma-delta-modulator 460 and modulated by $u_3[n-k_0]$ 3530, and noise added by sigma-delta-modulator 460 and modulated by $u_4[n-k_0]$ 3540 all statistically cancel or smooth out in-band.

Filter $H_1(z)$ 430 and $H_2(z)$ 450 include half-band filters with alternate zero coefficients as well as real and linear phase. Filter $H_1(z)$'s coefficients and filter $H_i(z)$'s coefficients are described in Table 1.

Filter $H_3(z)$ 470 and filter $H_3(z)$ 473 have symmetric transition bands and pass bands around $\pi/2$. Also, some of filter $H_3(z)$ 470's coefficients and filter $H_3(z)$ 473's coefficients are zero because of their symmetric transition bands around even dividers of $2\pi$. Filter $H_3(z)$ 470's coefficients and filter $H_3(z)$ 473's coefficients are described in Table 1.

TABLE 1

| \multicolumn{4}{c}{Numeric values of the channel filters} | | | |
|---|---|---|---|
| $H_1(z)$ | $H_2(z)$ | $H_3(z)$ | $H_4(z)$ |
| 0.0000 | 0.0000 | 0.0505 | 0.0505 |
| 0.0136 | −0.0136 | 0.0000 | 0.0000 |
| −0.0000 | −0.0000 | −0.0306 | −0.0306 |
| −0.0239 | 0.0239 | 0.0000 | 0.0000 |
| 0.0000 | 0.0000 | −0.0328 | −0.0328 |
| 0.0466 | −0.0466 | 0.0000 | 0.0000 |
| −0.0000 | −0.0000 | 0.1464 | 0.1464 |
| −0.0951 | 0.0951 | 0.0000 | 0.0000 |
| 0.0000 | 0.0000 | −0.2586 | −0.2586 |
| 0.3145 | −0.3145 | 0.0000 | 0.0000 |
| 0.5000 | 0.5000 | 0.3054 | 0.3054 |
| 0.3145 | −0.3145 | 0.0000 | 0.0000 |
| 0.0000 | 0.0000 | −0.2586 | −0.2586 |
| −0.0951 | 0.0951 | 0.0000 | 0.0000 |
| −0.0000 | −0.0000 | 0.1464 | 0.1464 |
| 0.0466 | −0.0466 | 0.0000 | 0.0000 |
| 0.0000 | 0.0000 | −0.0328 | −0.0328 |
| −0.0239 | 0.0239 | 0.0000 | 0.0000 |
| −0.0000 | −0.0000 | −0.0306 | −0.0306 |
| 0.0136 | −0.0136 | 0.0000 | 0.0000 |
| 0.0000 | 0.0000 | 0.0505 | 0.0505 |

Figure 5:
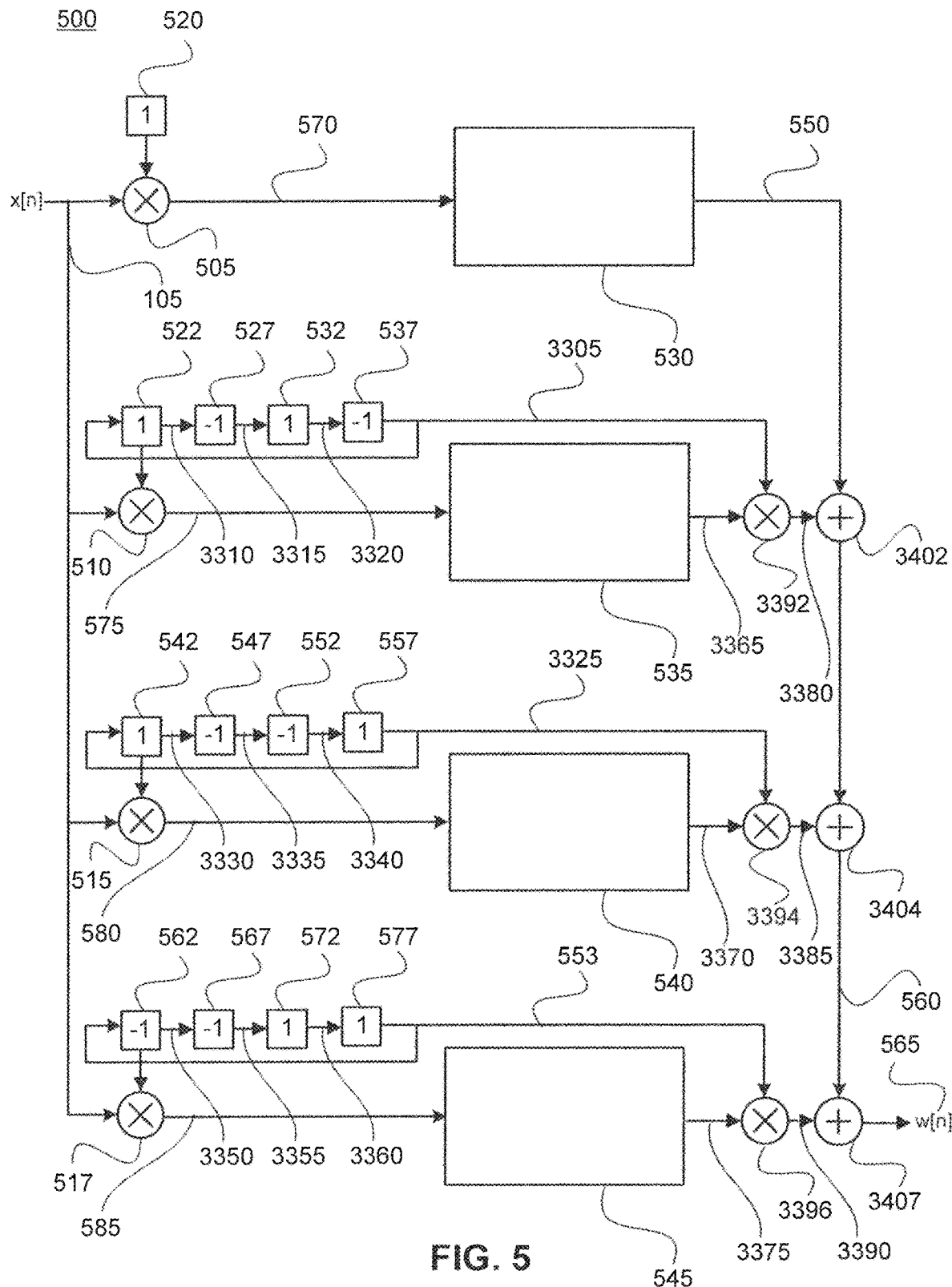
FIG. 5 illustrates a block diagram of an embodiment of a 4-branch, 7 word Finite Impulse Response (FIR) filter, Pi-Sigma-Delta modulator for wide band applications.
Figure 6:
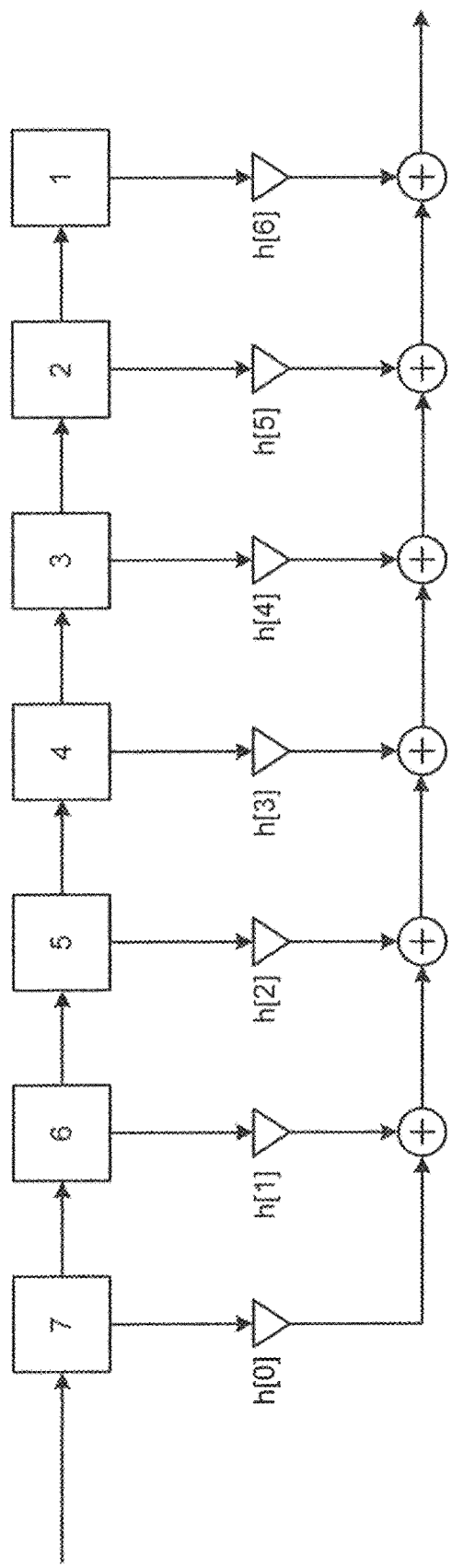
FIG. 6 illustrates the first branch of FIG. 5's 4-branch, 7 word FIR filter, Pi-Sigma-Delta modulator for wide band applications, according to an embodiment.
Figure 7:
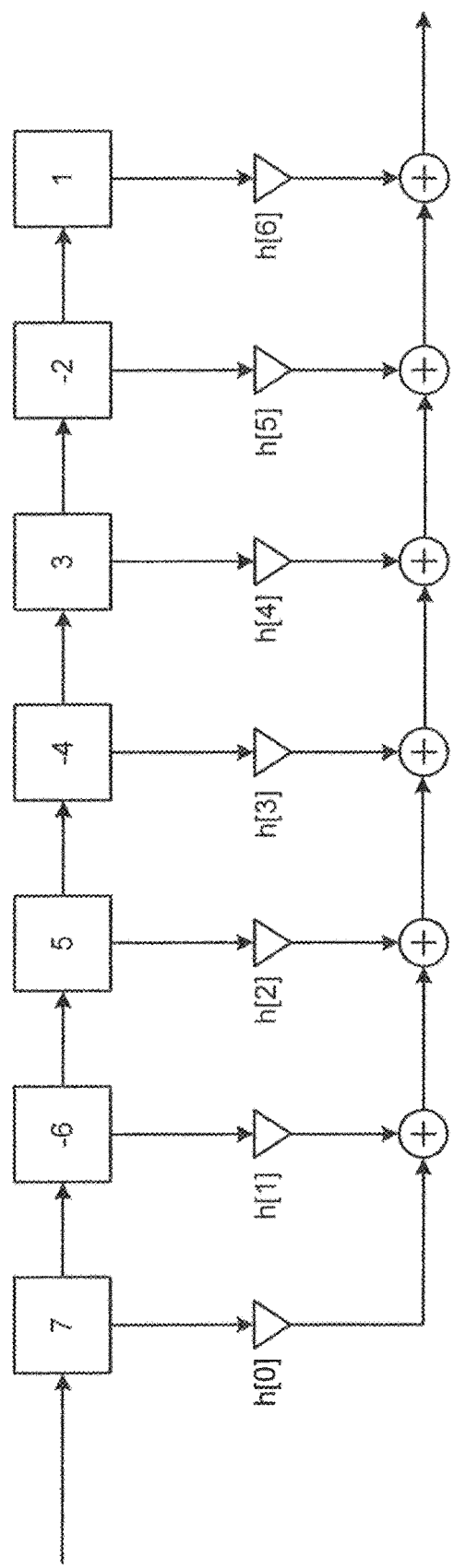
FIG. 7 illustrates the second branch of FIG. 5's 4-branch, 7 word FIR filter, Pi-Sigma-Delta modulator for wide band applications, according to an embodiment.

FIG. 5 illustrates an embodiment of a Pi-Sigma-Delta-modulator with a four branches and seven word FIR filters. The length of the FIR filter can influence how sharp the transition band will be. A sharp transition band can remove more of the out-of-band quantization noise. However this comes at the cost of more coefficients and hence a higher number of multipliers in the hardware design. The Hadamard code in the first branch of this embodiment is 1, 1, 1, 1. However, a person having ordinary skill in the art will understand that when implemented, x[n] 105 is not multiplied by Hadamard code 1, 1, 1, 1, as multiplying by Hadamard code 1, 1, 1, 1 is equivalent to multiplying x[n] 105 by 1. Sigma-delta modulator and H(z) filter 530 are implemented in this embodiment as a FIR filter as illustrated by FIG. 6. This FIR filter removes some of the out-of-band noise introduced by the sigma-delta modulator. Hadamard codes illustrated in FIG. 5 are stored in a memory, such as registers. For example, Hadamard code 1, −1, 1, −1 in the second branch, the left most 1 of this Hadamard code is stored in register 522, the left most −1 is stored in register 527, the right most 1 is stored in register 532, and the right most −1 is stored in register 537. The Hadamard code in the second branch of this embodiment is 1, −1, 1, −1, stored in registers 522, 527, 532, and 537 respectively, which, when multiplied by x[n] 105, via multiplier 505, modulates x[n] 105. Sigma-delta modulator and H(z) filter 535 removes some out-of-band noise. Digital signal 3365 is then multiplied by Hadamard code 1, −1, 1, −1, 522, 527, 532, and 537 respectively, to modulate signal 3365. The second multiplication in the second branch by Hadamard code 1, −1, 1, −1, stored in registers 522, 527, 532, and 537 respectively, demodulate x[n] 105 and modulates noise with an orthogonal frequency. Sigma-delta modulator and H(z) filter 535 are implemented in this embodiment as a FIR filter as illustrated by FIG. 7.

Figure 8:
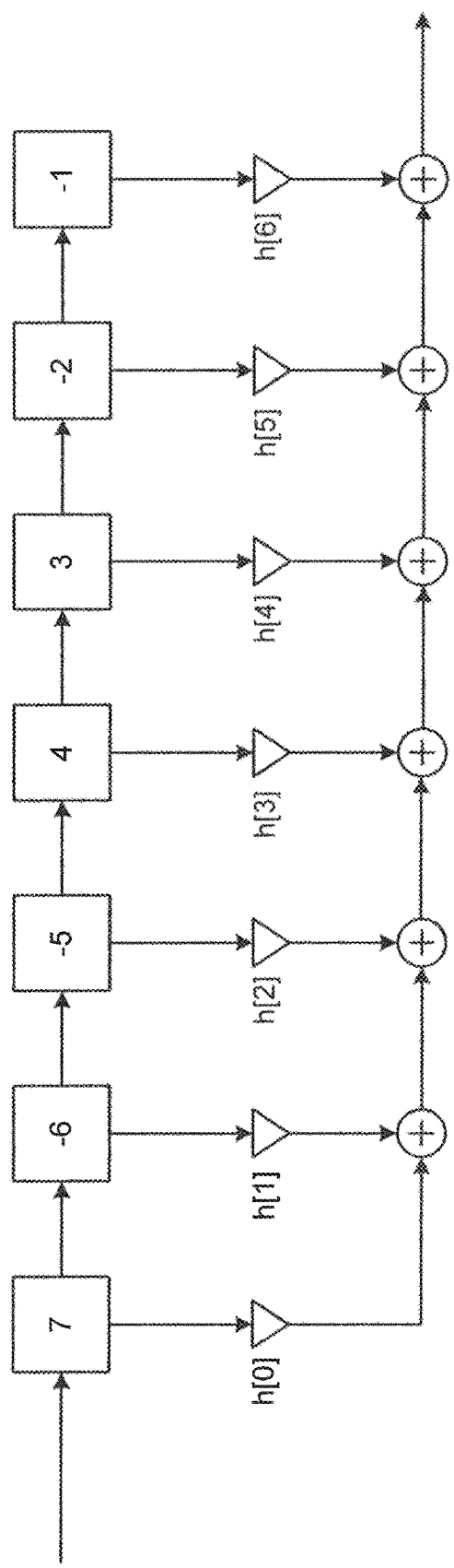
FIG. 8 illustrates the third branch of FIG. 5's 4-branch, 7 word FIR filter, Pi-Sigma-Delta modulator for wide band applications, according to an embodiment.

The Hadamard code in the third branch of this embodiment is 1, −1, −1, 1, stored in registers 542, 547, 552, and 557 respectively, which, when multiplied by x[n] 105, via multiplier 515, modulates x[n] 105. Digital signal 3370 is then multiplied by Hadamard code 1, −1, −1, 1, stored in registers 542, 547, 552, and 557 respectively, to demodulate signal x[n] 105 and modulate noise with an orthogonal frequency. Sigma-delta modulator and H(z) filter 540 are implemented in this embodiment as a FIR filter as illustrated by FIG. 8.

Figure 9:
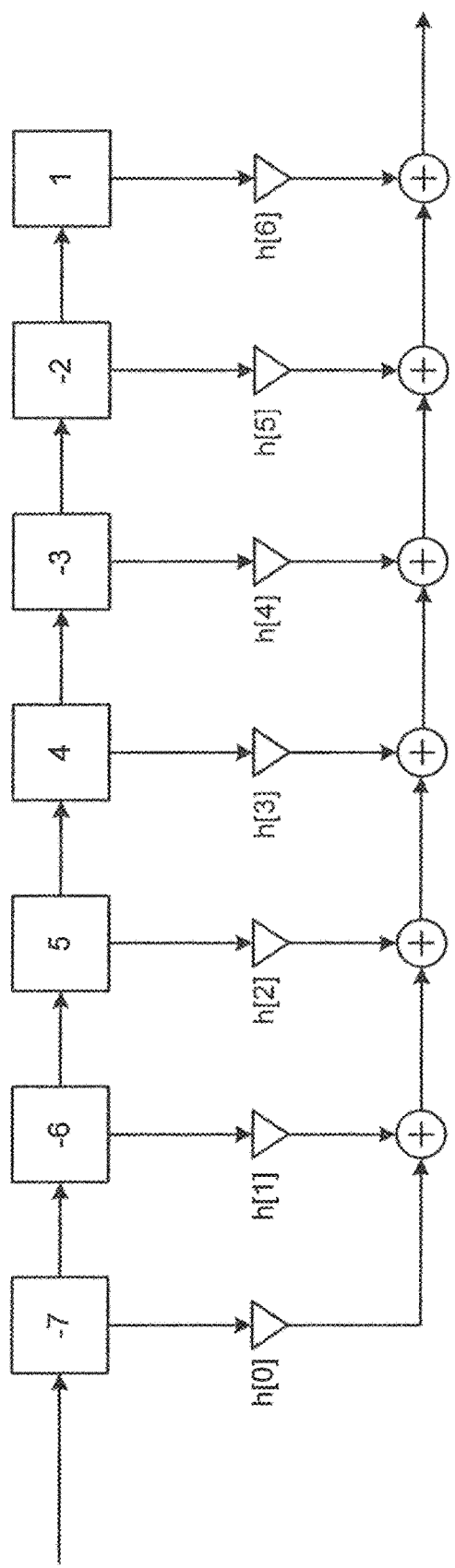
FIG. 9 illustrates the fourth branch of FIG. 5's 4-branch, 7 word FIR filter, Pi-Sigma-Delta modulator for wide band applications, according to an embodiment.

The Hadamard code in the fourth branch of this embodiment is −1, −1, 1, 1, stored in registers 562, 567, 572, and 577 respectively, which, when multiplied by x[n] 105 via multiplier 517 modulates x[n] 105 and also modulates x[n] 105's phase. Digital signal 3375 is then multiplied by Hadamard code −1, −1, 1, 1, stored in registers 562, 567, 572, and 577 respectively, to demodulate x[n] 105, modulate noise with an orthogonal frequency and also modulates digital signal 105's phase. Sigma-delta modulator and H(z) filter 545 are implemented in this embodiment as a FIR filter as illustrated by FIG. 9.

Hadamard codes 1, 1, 1, 1, and 1, −1, 1, −1, and 1, −1, −1, 1, are all orthogonal to each other and modulate the noise added by sigma-delta modulators 530, 535, and 540. Hadamard codes 1, 1, 1, 1, and 1, −1, 1, −1, and −1, −1, 1, 1, are all orthogonal to each other and modulate the noise added by sigma-delta modulators 530, 535, and 545. Hadamard codes 1, −1, −1, 1 and −1, −1, 1, 1 are orthogonal in phase. The result of summing the Hadamard modulated noise added by these sigma-delta modulators is to statistically cancel or smooth out this Hadamard modulated noise in-band when signals 550, 3380, 3385, and 3390 are summed via adders 3402, 3404, and 3407 and output via w[n] 565.

Figure 10:
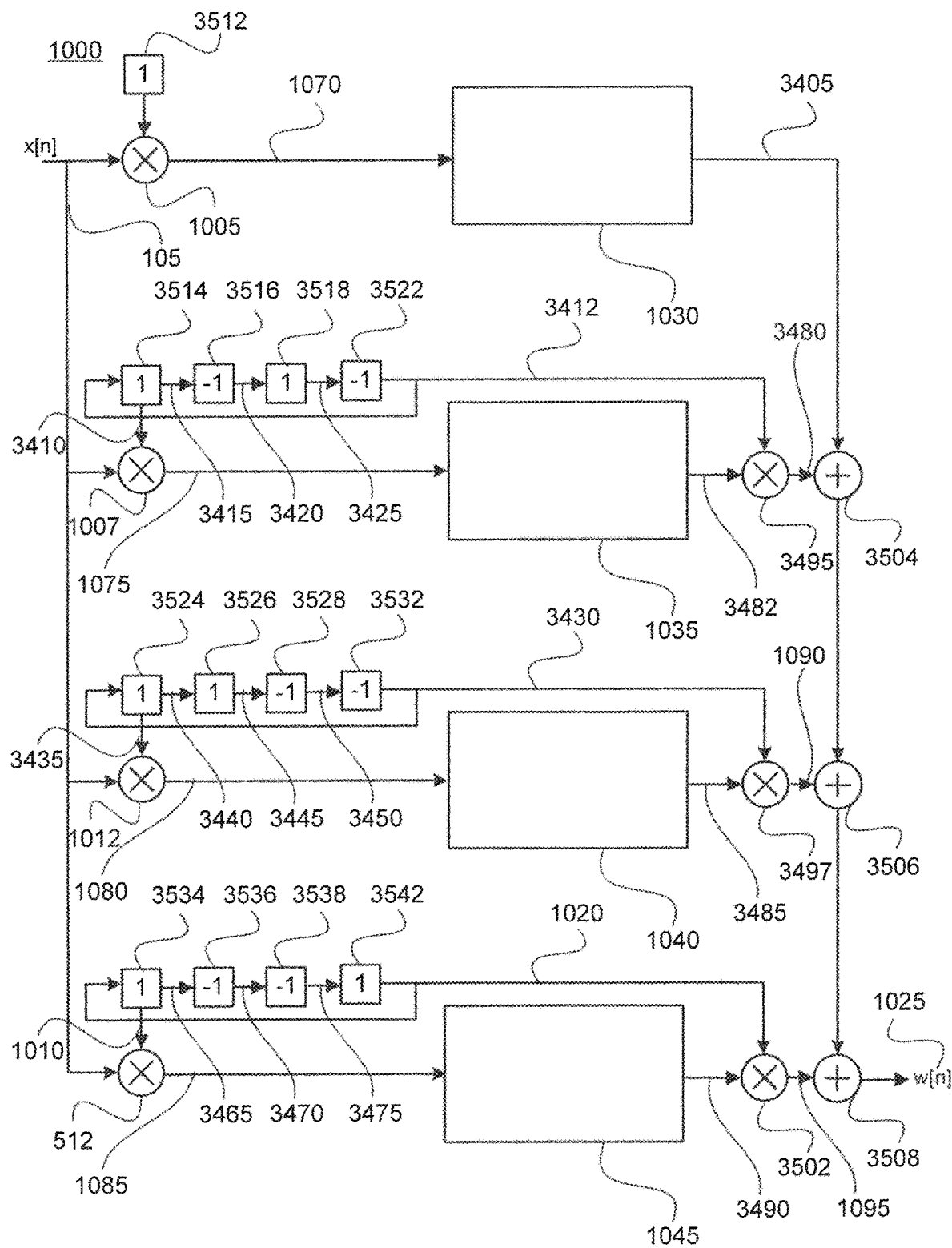
FIG. 10 illustrates a block diagram of a 4-branch, 11 word FIR filter, Pi-Sigma-Delta modulator for wide band applications, according to an embodiment.
Figure 11:
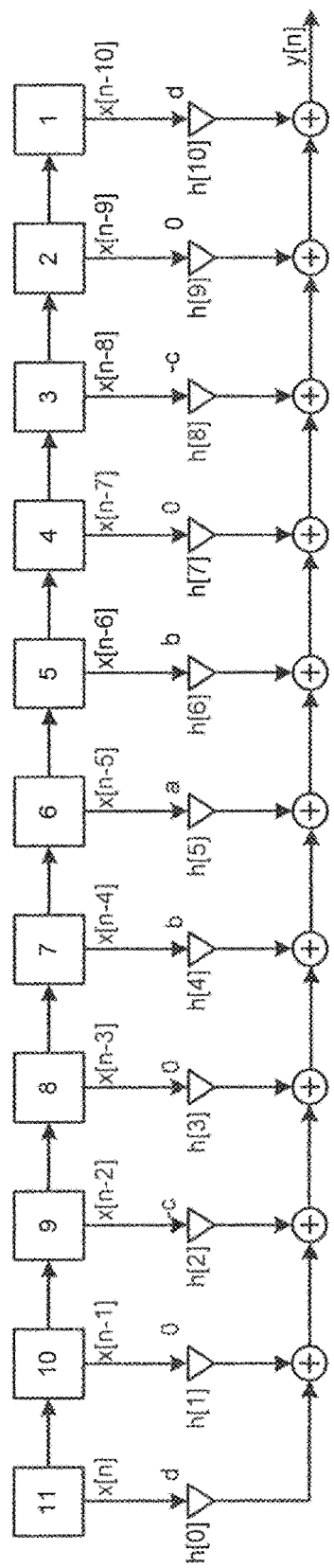
FIG. 11 illustrates the first branch of FIG. 10's 4-branch, 11 word FIR filter, Pi-Sigma-Delta modulator for wide band applications, according to an embodiment.
Figure 15:
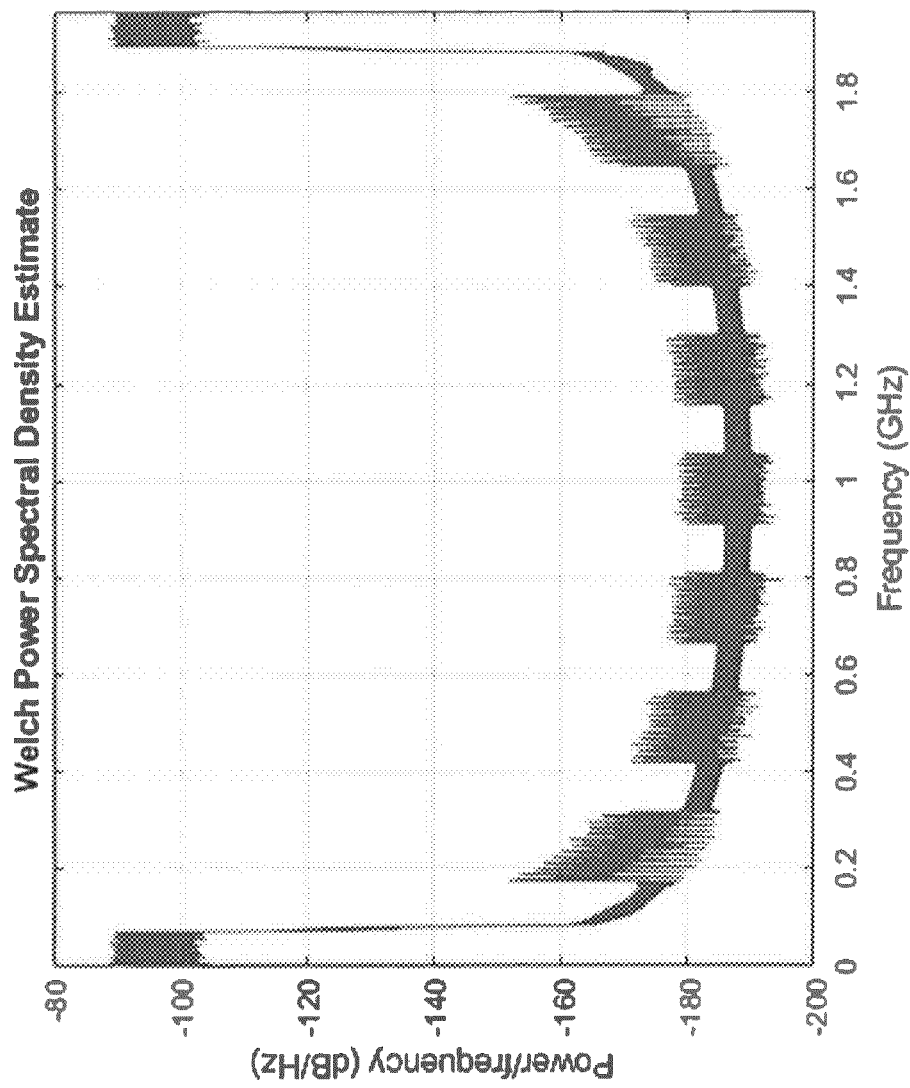
FIG. 15 illustrates the power spectral density of the Hadamard modulated first branch, of a 4-branch and also an 8-branch, Pi-Sigma-Delta modulator for wide band applications, according to an embodiment.

FIG. 10 illustrates an embodiment of a Pi-Sigma-Delta-modulator with four branches and an 11 word FIR filter. The Hadamard code in the first branch of this embodiment is 1, 1, 1, 1. However, a person having ordinary skill in the art will understand that when implemented, x[n] 105 is not multiplied by a Hadamard code 1, 1, 1, 1, as multiplying by Hadamard code 1, 1, 1, 1, is equivalent to multiplying x[n] 105 by 1. Sigma-delta modulator and H(z) filter 1030 are implemented in this embodiment as an FIR filter as illustrated by FIG. 11. This embodiment's FIR filter shapes and filters noise to smooth error. FIG. 15 illustrates the power spectral density of x[n] 105.

Figure 12:
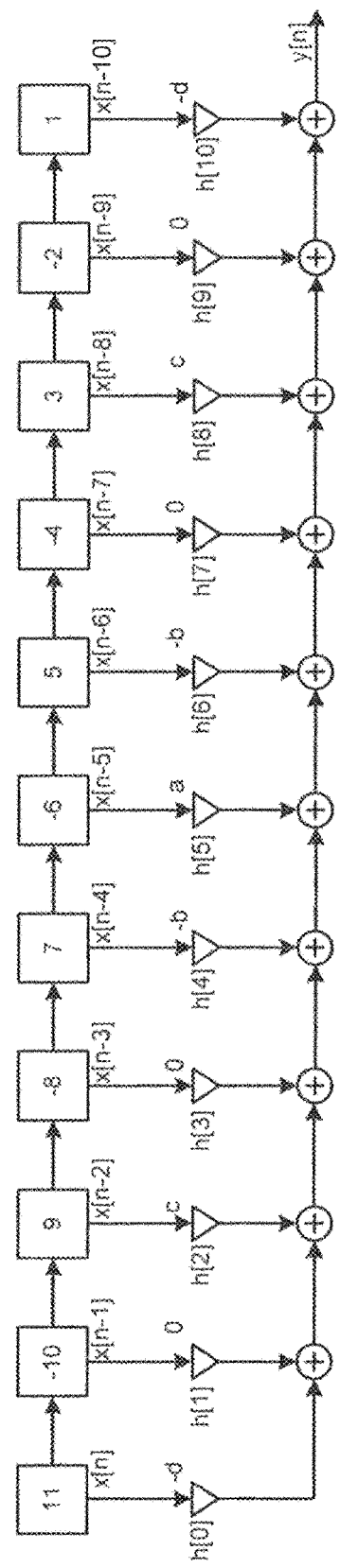
FIG. 12 illustrates the second branch of FIG. 10's 4-branch, 11 word FIR filter, Pi-Sigma-Delta modulator for wide band applications, according to an embodiment.
Figure 16:
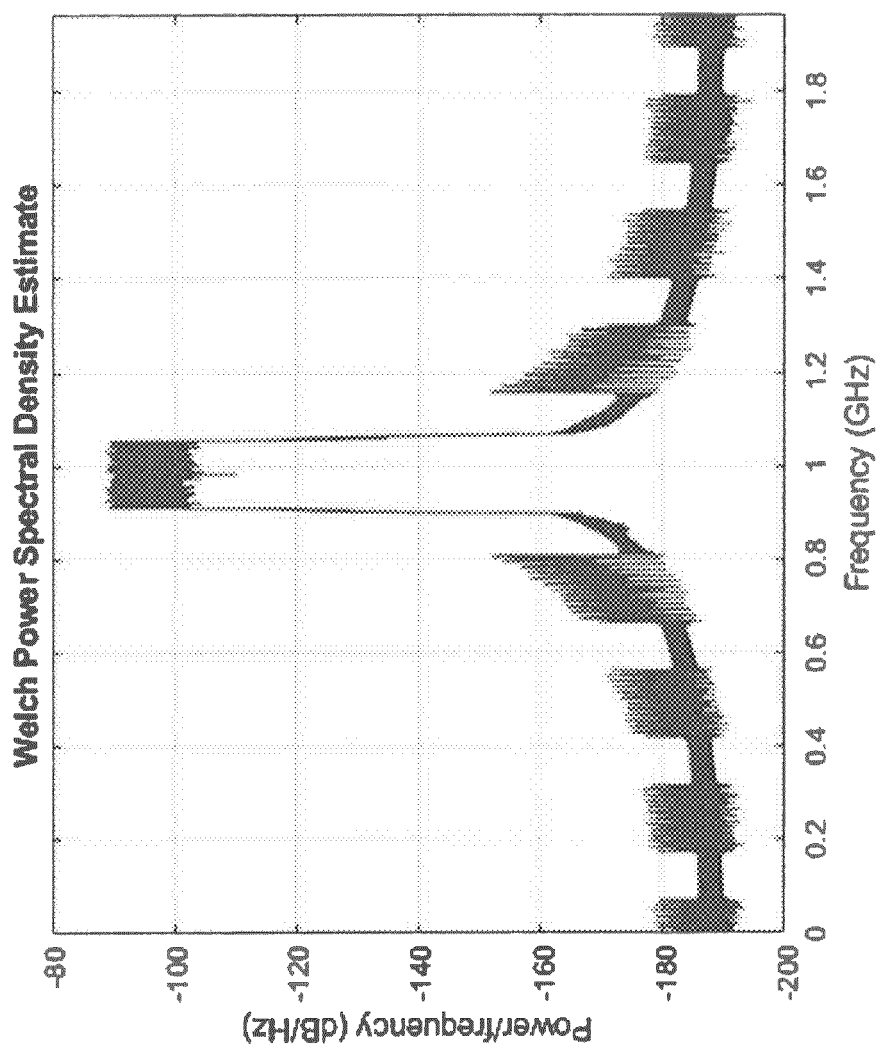
FIG. 16 illustrates the power spectral density of the Hadamard modulated second branch, of a 4-branch and also an 8-branch, Pi-Sigma-Delta modulator for wide band applications, according to an embodiment.

The Hadamard code in the second branch of this embodiment is 1, −1, 1, −1, stored in registers 3514, 3516, 3518, and 3522 respectively, which, when multiplied by x[n] 105 via multiplier 1007, modulates x[n] 105. FIG. 16 illustrates the Hadamard modulated signal 1075 after x[n] 105 is multiplied by Hadamard code 1, −1, 1, −1, stored in registers 3514, 3516, 3518, and 3522 respectively. Sigma-delta modulator and H(z) filter 1035 shapes and filters noise to smooth error. Digital signal 3480 is then multiplied by Hadamard code 1, −1, 1, −1, stored in registers 3514, 3516, 3518, and 3522 respectively, to demodulate x[n] 105 and modulate noise. Sigma-delta modulator and H(z) filter 1035 are implemented in this embodiment as a FIR filter as illustrated by FIG. 12.

Figure 13:
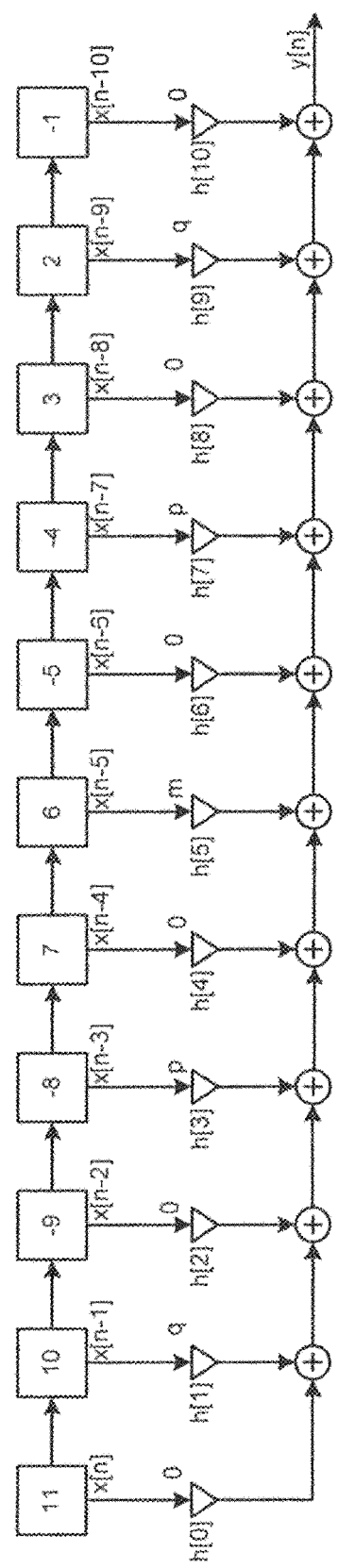
FIG. 13 illustrates the third branch of FIG. 10's 4-branch, 11 word FIR filter, Pi-Sigma-Delta modulator for wide band applications, according to an embodiment.
Figure 17:
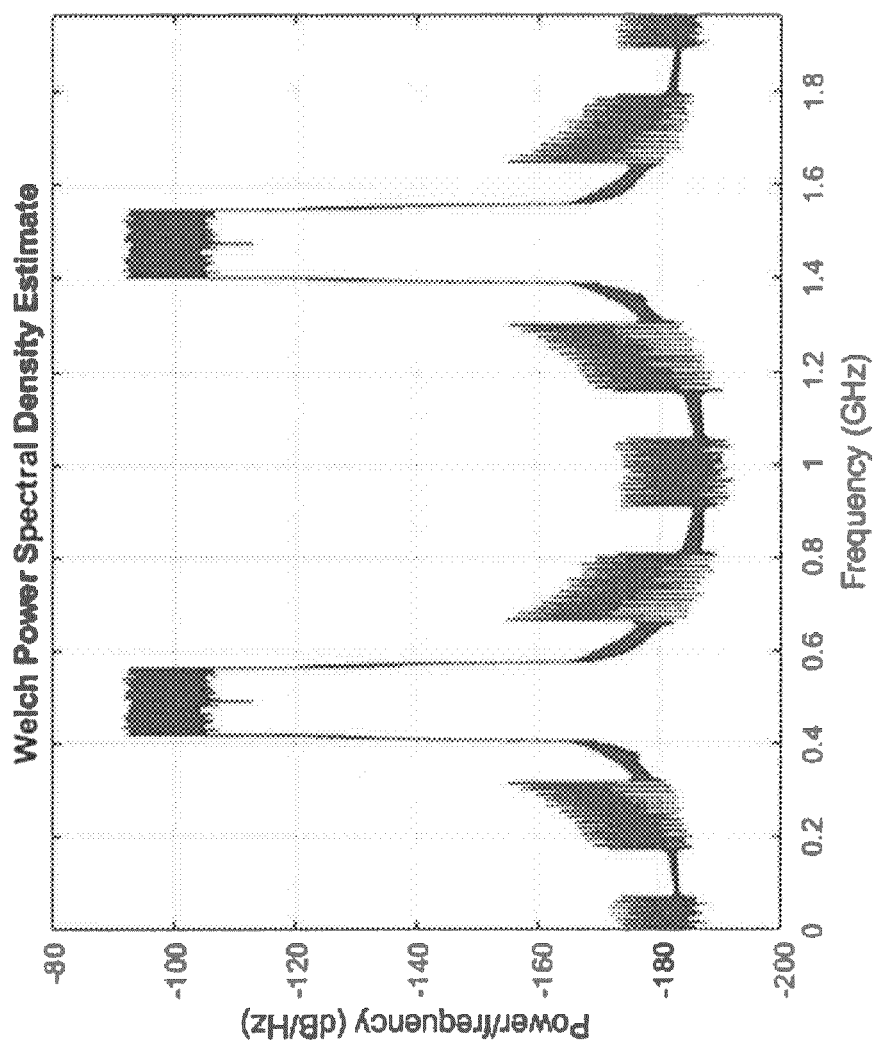
FIG. 17 illustrates the power spectral density of the Hadamard modulated third branch, of a 4-branch and also an 8-branch, Pi-Sigma-Delta modulator for wide band applications, according to an embodiment.

The Hadamard code in the third branch of this embodiment is 1, 1, −1, −1, stored in registers 3524, 3526, 3528, and 3532 respectively, which, when multiplied by x[n] 105 via multiplier 1012 modulates x[n] 105. FIG. 17 illustrates the Hadamard modulated signal 1080 after x[n] 105 is multiplied by Hadamard code 1, 1, −1, −1, stored in registers 3524, 3526, 3528, and 3532 respectively. FIG. 17 also illustrates the effect of modulating x[n] 105 which is an image of modulated signal x[n] 105. Digital signal 3485 is then multiplied by Hadamard code 1, 1, −1, −1, stored in registers 3524, 3526, 3528, and 3532 respectively, to demodulate x[n] 105 and modulate noise. Sigma-delta modulator and H(z) filter 1040 are implemented in this embodiment as a FIR filter as illustrated by FIG. 13.

Figure 14:
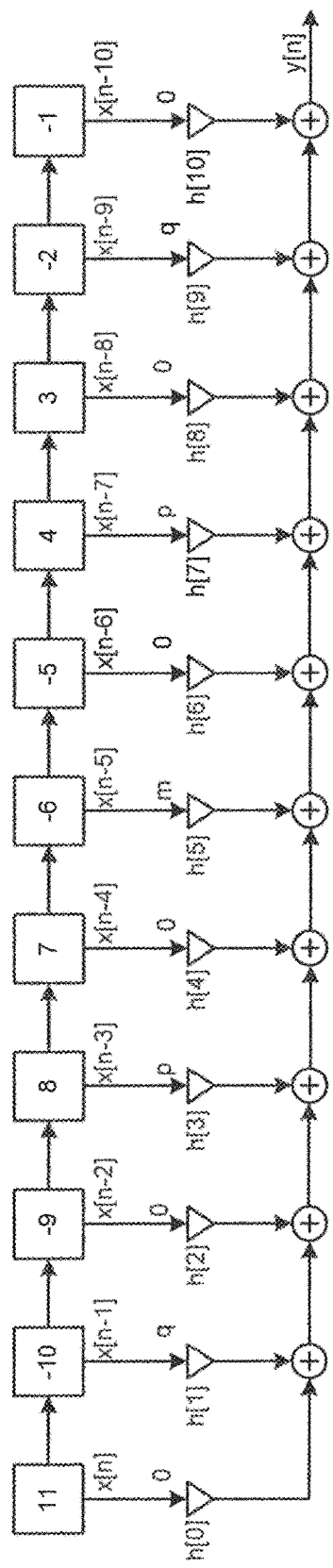
FIG. 14 illustrates the fourth branch of FIG. 10's 4-branch, 11 word FIR filter, Pi-Sigma-Delta modulator for wide band applications, according to an embodiment.
Figure 18:
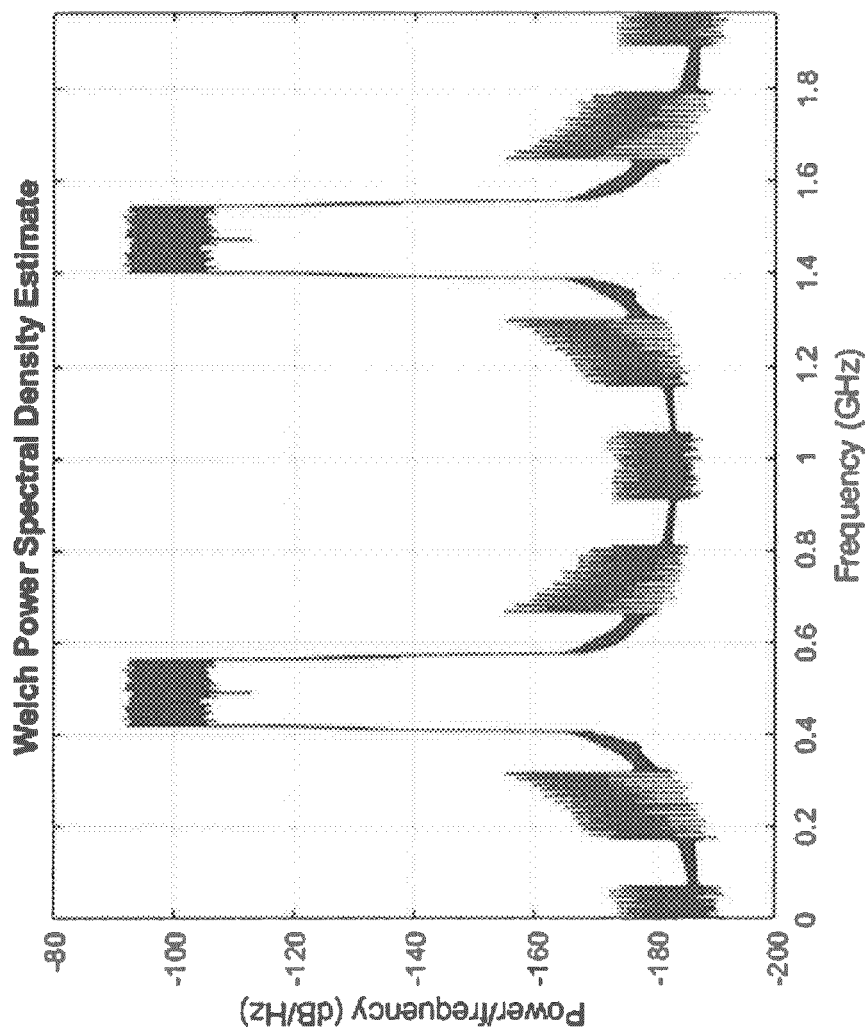
FIG. 18 illustrates the power spectral density of the Hadamard modulated fourth branch, of a 4-branch and also an 8-branch, Pi-Sigma-Delta modulator for wide band applications, according to an embodiment.

The Hadamard code in the fourth branch of this embodiment is 1, −1, −1, 1, stored in registers 3534, 3536, 3538, and 3542 respectively, which, when multiplied by x[n] 105 via multiplier 512 shifts the frequency of x[n] 105 by π/2 Radians and also modulates the phase. FIG. 18 illustrates the Hadamard modulated signal 1085 after x[n] 105 is multiplied by Hadamard code 1, −1, −1, 1, stored in registers 3534, 3536, 3538, and 3542 respectively. Digital signal 3490 is then multiplied by Hadamard code 1, −1, −1, 1, stored in registers 3534, 3536, 3538, and 3542 respectively, as signal 1020, via multiplier 3502, demodulates x[n] 105, modulates noise and also modulates the signal's phase. This signal is output w[n] 1025. Sigma-delta modulator and H(z) filter 1045 are implemented in this embodiment as a FIR filter as illustrated by FIG. 14.

Hadamard codes 1, 1, 1, 1, and 1, −1, 1, −1, and 1, 1, −1, −1, are all orthogonal in frequency and modulate the noise added by sigma-delta modulators 1030, 1035, and 1040. Hadamard codes 1, 1, 1, 1, and 1, −1, 1, −1, and 1, −1, −1, 1, are all orthogonal in frequency and modulate the noise added by sigma-delta modulators 1030, 1035, and 1045. Hadamard codes 1, 1, −1, −1, and 1, −1, −1, 1 are orthogonal in phase. The result of summing the Hadamard modulated noise added by these sigma-delta modulators is to statistically cancel or smooth this Hadamard modulated in-band noise when signals 3405, 3480, 1090, and 1095 are summed.

Figure 19:
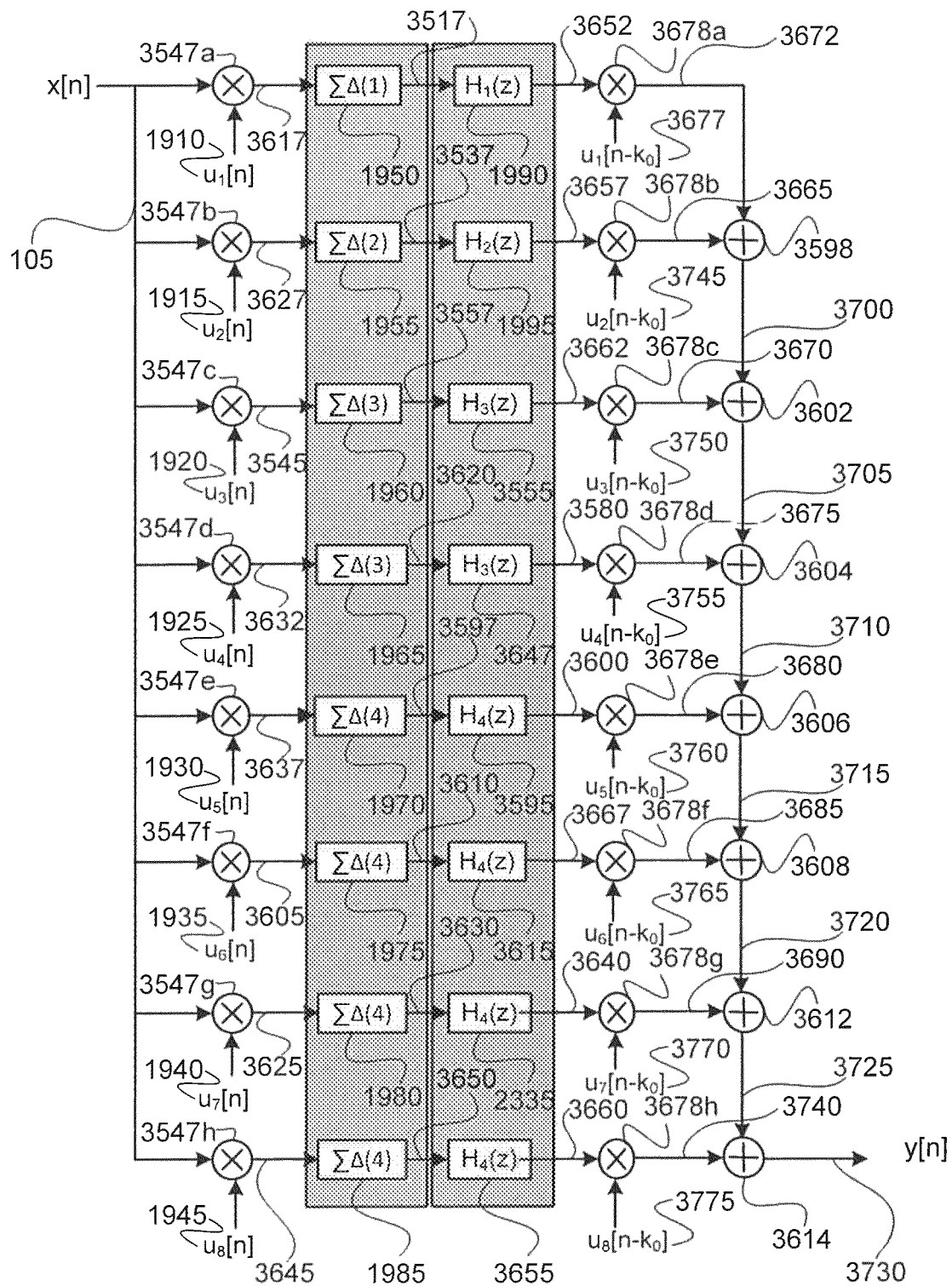
FIG. 19 illustrates a block diagram of an 8-branch Pi-Sigma-Delta-modulator for wide band applications, according to an embodiment.
Figure 20:
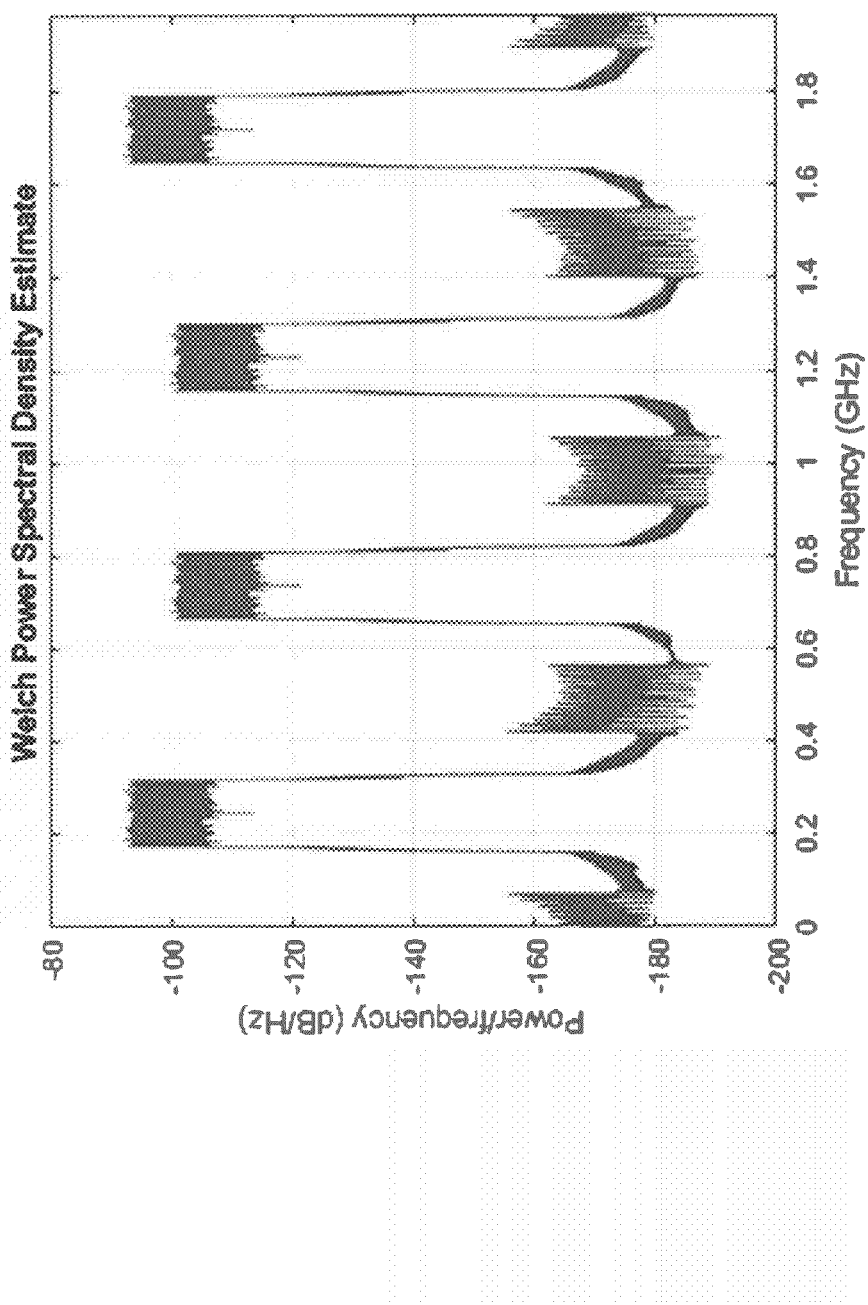
FIG. 20 illustrates the power spectral density of the Hadamard modulated fifth branch, of an 8-branch, Pi-Sigma-Delta modulator for wide band applications, according to an embodiment.
Figure 21:
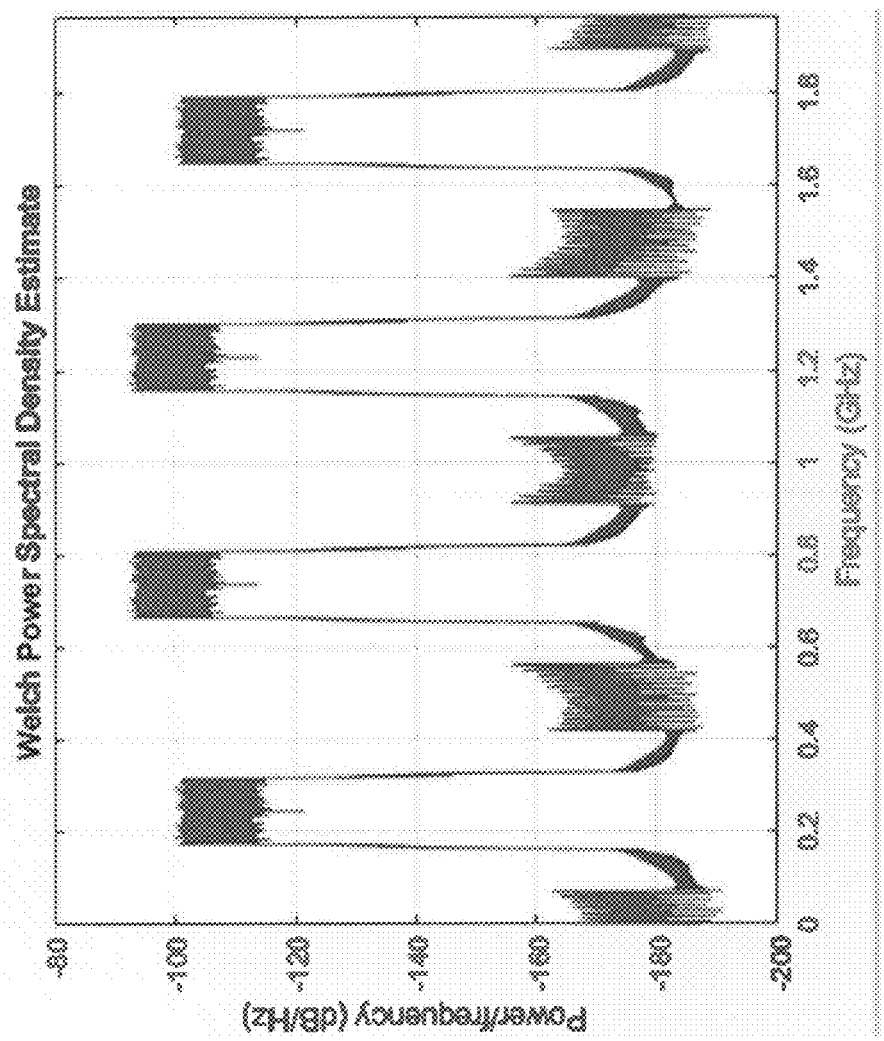
FIG. 21 illustrates the power spectral density of the Hadamard modulated sixth branch, of an 8-branch, Pi-Sigma-Delta modulator for wide band applications, according to an embodiment.
Figure 22:
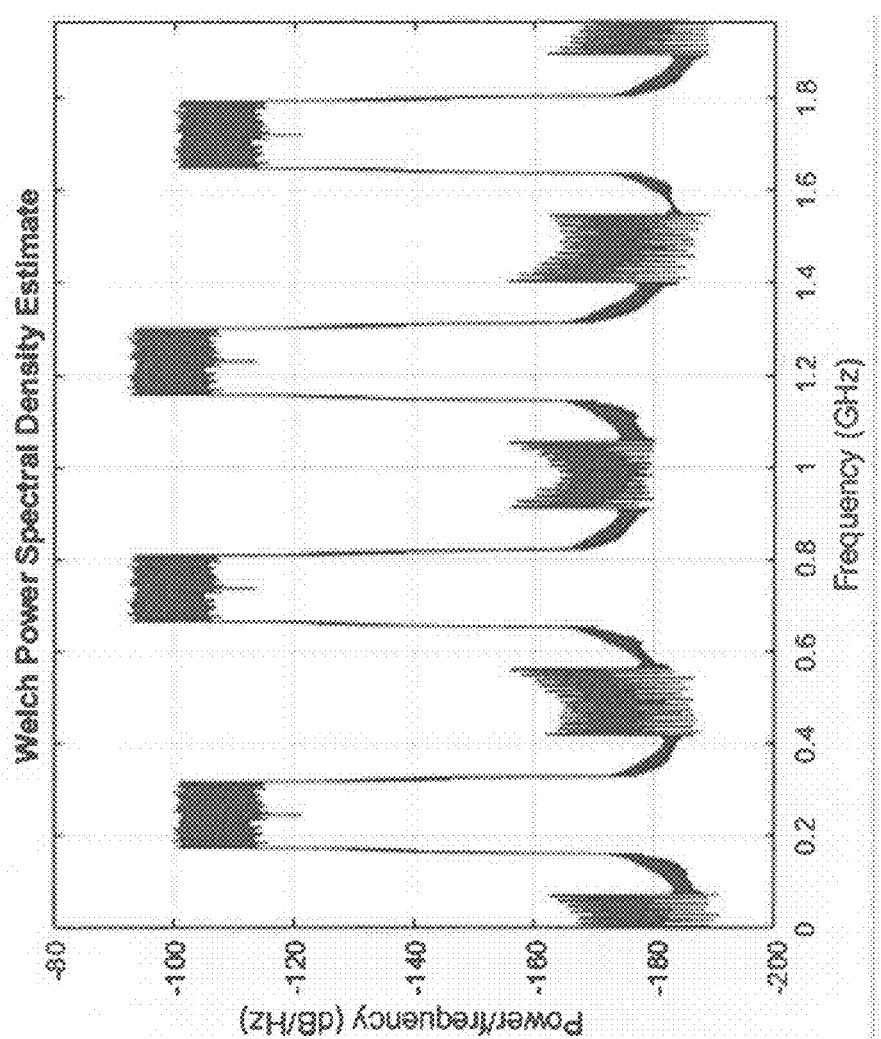
FIG. 22 illustrates the power spectral density of the Hadamard modulated seventh branch, of an 8-branch, Pi-Sigma-Delta modulator for wide band applications, according to an embodiment.
Figure 23:
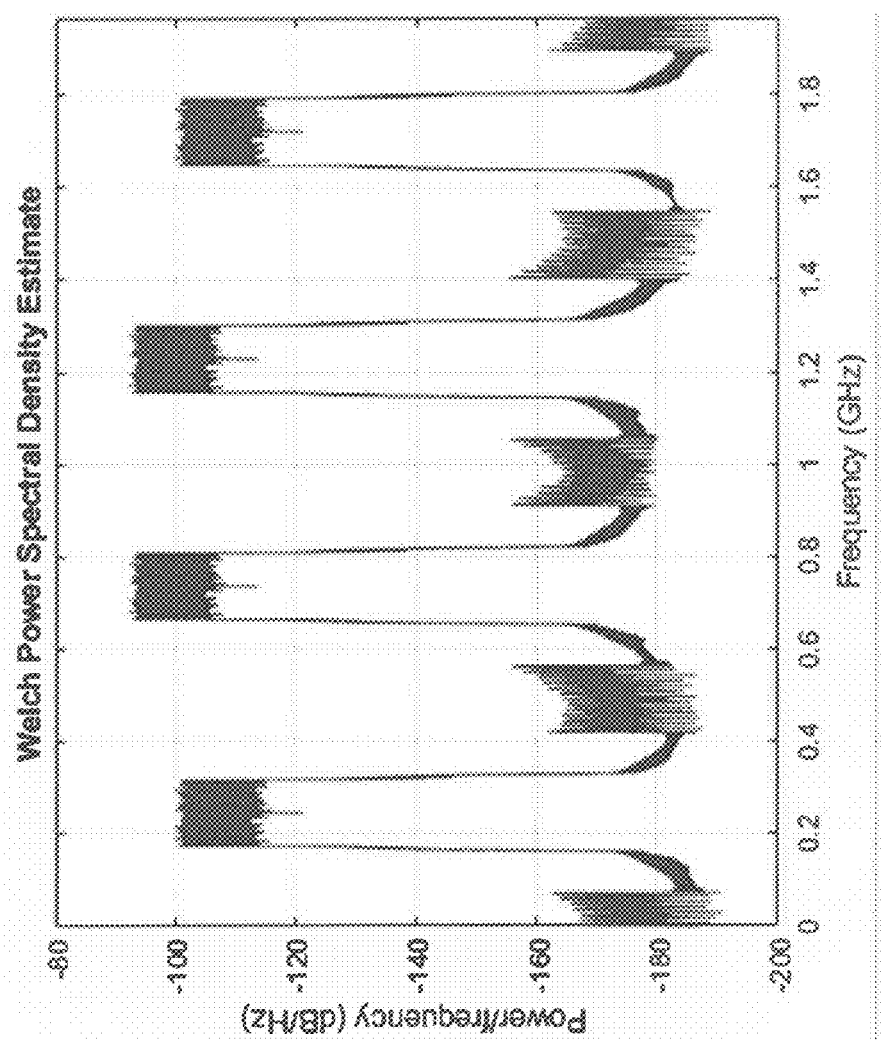
FIG. 23 illustrates the power spectral density of the Hadamard modulated eighth branch, of an 8-branch, Pi-Sigma-Delta modulator for wide band applications, according to an embodiment.

FIG. 19 illustrates an embodiment of an eight branch Pi-Sigma-Delta-modulator. Analog signal 105 is multiplied, via multiplier 3547, by Hadamard code $u_1[n]$ 1910 in the first branch, $u_2[n]$ 1915 in the second branch, $u_3[n]$ 1920 in the third branch, $u_4[n]$ 1925 in the fourth branch, $u_5[n]$ 1930 in the fifth branch, $u_6[n]$ 1935 in the sixth branch, $u_7[n]$ 1940 in the seventh branch, and $u_8[n]$ 1945 in the eighth branch. Digital signals 3517, 3537, 3557, 3620, 3597, 3610, 3630, and 3650 are filtered by H(z) filters 1990, 1995, 3555, 3647, 3595, 3615, 2335, and 3655. Signals 3545 and 3632, resulting from multiplying x[n] 105 by Hadamard codes $u_3[n]$ 1920 and $u_4[n]$ 1925 respectively have the same spectral density, as illustrated by FIG. 17 and FIG. 18. Therefore, the sigma-delta modulator and H(z) filter in these branches are the same because the sigma-delta-modulator is tuned to Hadamard code $u_3[n]$ 1920 is also tuned to Hadamard code $u_4[n]$ 1925 and can be used in both the third and fourth branches. The zeros of these sigma-delta-modulator's NTFs are located at the center of signals 3545 and 3632 after being modulated by Hadamard code $u_3[n]$ 1920 $u_4[n]$ 1925. Also, the same sigma-delta-modulator is used in the fifth, sixth, seventh, and eighth branches. This is because a sigma-delta-modulator tuned to Hadamard codes $u_5[n]$ 1930 is also tuned to Hadamard codes $u_6[n]$ 1935, $u_7[n]$ 1940, and $u_8[n]$ 1945 as the spectral density of the signals frequency modulated by these Hadamard codes is the same. Signals 3637, 3605, 3625, and 3645 resulting from multiplying x[n] 105 by Hadamard codes $u_5[n]$ 1930, $u_6[n]$ 1935, $u_7[n]$ 1940, and $u_8[n]$ 1945 have the same spectral density as illustrated by FIGS. 20 through 23. Therefore, the sigma-delta modulator and H(z) filter in these branches are the same because the zeros of their NTFs are located at the center of digital signals 3637, 3605, 3625, and 3645 after being modulated by Hadamard code $u_5[n]$ 1930, $u_6[n]$ 1935, $u_7[n]$ 1940, and $u_8[n]$ 1945. Filtered digital signals 3652, 3657, 3662, 3580, 3600, 3667, 3640, 3660 are multiplied, via multiplier 3678, by Hadamard codes $u_1[n-k_0]$ 3677, $u_2[n-k_0]$ 3745, $u_3[n-k_0]$ 3750, $u_4[n-k_0]$ 3755, $u_5[n-k_0]$ 3760, $u_6[n-k_0]$ 3765, $u_7[n-k_0]$ 3770, and $u_8[n-k_0]$ 3775. Hadamard codes $u_1[n-k_0]$ 3677, $u_2[n-k_0]$ 3745, $u_3[n-k_0]$ 3750, $u_4[n-k_0]$ 3755, $u_5[n-k_0]$ 3760, $u_6[n-k_0]$ 3765, $u_7[n-k_0]$ 3770, and $u_8[n-k_0]$ 3775 are all orthogonal to each other and statistically cancel, or smooth the error when summed.

Error Vector Magnitude (EVM) can be used to quantify the performance of digital radio transmitters and receivers. EVM is defined as the square root of the ratio of the mean error vector (the difference between the reference signal and measured signal) to the mean reference power expressed as a percentage. The EVM interval measurement is one time slot in the time domain. EVM required by 64 QAM LTE is 8%. Embodiments exceed this requirement and have a 1% EVM.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. A Signal Processor (SP) comprising:
   a first branch including:
      a first sigma-delta modulator having an associated first noise transfer function (NTF);
      the first NTF has zeros centered at a first frequency; and
      a first frequency shifter configured to shift a first portion of an input signal to the first frequency;
   a second branch parallel to the first branch including:
      a second sigma-delta modulator having an associated second NTF different than the first NTF;
      the second NTF has zeros centered at a second frequency; and
      a second frequency shifter configured to shift a second portion of the input signal to the second frequency different than the first frequency; and
   a signal recombiner for combining the output of the first and second branches.

2. The SP of claim 1 wherein:
   the first branch includes a first filter with a passband at the first frequency; and
   the second branch includes a second filter with a passband at the second frequency.

3. The SP of claim 2 further comprising:
   a third branch including:
      a third sigma delta modulator having an associated third NTF that is different than the first NTF and the second NTF, the third NTF having a zero centered at a third frequency different than the first and second frequencies;
      a third frequency shifter for shifting the input signal to the third frequency; and
      a third filter having a passband at the third frequency.

4. The SP of claim 3 further comprising:
   a fourth branch including:
      a fourth sigma-delta-modulator having an associated fourth NTF having zeros centered at the third frequency;
      a fourth frequency shifter for shifting the input signal to the third frequency and for shifting the input signal in phase by π/2 radians; and
      a fourth filter having a passband at the third frequency.

5. The SP of claim 3 further comprising:
   a fourth branch including a fourth sigma-delta modulator having an associated fourth NTF that is the same as one of the first NTF, the second NTF and the third NTF.

6. The SP of claim 3 wherein each of the sigma-delta-modulators are one of:
   first order sigma-delta modulator;
   second order sigma-delta modulator; and
   third order sigma-delta modulator.

7. The SP of claim 2 wherein the frequency shifter in each branch includes a multiplier and a Hadamard code block that apply a Hadamard code to the input signal in each branch of the SP.

8. The SP of claim 7 wherein the Hadamard code applied by each frequency shifter is orthogonal to the Hadamard code applied by each other frequency shifter.

9. The SP of claim 8 wherein the NTF of each branch is matched to the Hadamard code associated with the frequency shifter of that branch such that quantization noise is shaped away from the shifted frequency of that branch.

10. The SP of claim 2 wherein at least one of the first and second sigma-delta-modulator and corresponding filter are formed from a seven element Finite Impulse Response (FIR) Filter.

11. The SP of claim 4 wherein:
   the first frequency shifter applies Hadamard code 1, 1, 1, 1;
   the second frequency shifter applies Hadamard code 1, −1, 1, −1;
   the third frequency shifter applies Hadamard code 1, −1, −1, 1; and
   the fourth frequency shifter applies Hadamard code −1, −1, 1, 1.

12. The SP of claim 9 wherein the sigma-delta-modulator and filter of each branch are formed from an eleven element Finite Impulse Response (FIR) Filter.

13. The SP of claim 8 wherein a length of the Hadamard code associated with each Hadamard code block is equal to the number of parallel branches each receiving an input signal.

14. The SP of claim 9 wherein the NTF of each branch are related.

15. The SP of claim 14 wherein the NTF of the second branch uses the NTF of the first branch shifted by $je^{j\pi n}$ wherein n=(k Mod N) where N is 2 and k is {0,1}.

16. The SP of claim 15 wherein the NTF of the third branch uses the NTF of the second branch shifted by upsampling by 2.

17. The SP of claim 16 wherein the third and fourth filters include:
   symmetric transition bands; and
   passband centered at π/2 and 3 π/2 radians/sample.

18. The SP of claim 9 wherein the signal recombiner includes an adder, and for each branch, a multiplier for multiplying the output from the filter with the Hadamard code of that branch.

19. A signal processor comprising:
   a plurality of branches,
   each branch of the plurality of branches including a frequency shifter, a sigma delta modulator and a filter, wherein each frequency shifter is configured to apply a frequency shift orthogonal to the frequency shift applied by the frequency shifters of other branches, and the sigma delta modulator of each of the plurality of branches having a noise transfer function matched to the frequency shifter of that branch.

* * * * *